(12) United States Patent
Rusu

(10) Patent No.: US 10,923,463 B2
(45) Date of Patent: Feb. 16, 2021

(54) METHOD AND MACHINE-READABLE MEDIUM FOR CONFIGURING PROCESSORS WITH BASE DIES HAVING LANDING SLOTS

(71) Applicant: Intel Corporation, Santa Clara, CA (US)

(72) Inventor: Stefan Rusu, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/590,057

(22) Filed: Oct. 1, 2019

(65) Prior Publication Data

US 2020/0035659 A1   Jan. 30, 2020

Related U.S. Application Data

(60) Continuation of application No. 15/370,904, filed on Dec. 6, 2016, now Pat. No. 10,431,573, which is a
(Continued)

(51) Int. Cl.
*G06F 15/76* (2006.01)
*H01L 25/18* (2006.01)
(Continued)

(52) U.S. Cl.
CPC .............. *H01L 25/18* (2013.01); *G06F 15/76* (2013.01); *H01L 23/481* (2013.01);
(Continued)

(58) Field of Classification Search
CPC ... H04L 41/22; H04L 51/046; H01L 25/0657; H01L 25/50; H01L 2225/06593;
(Continued)

(56) References Cited

U.S. PATENT DOCUMENTS

2001/0047251 A1* 11/2001 Kemp ................ G06F 30/13
703/1
2002/0152060 A1* 10/2002 Tseng ................ G06F 30/33
703/17
(Continued)

OTHER PUBLICATIONS

Final Office Action from U.S. Appl. No. 15/370,904, dated Feb. 8, 2019, 10 pages.
(Continued)

*Primary Examiner* — Caridad Everhart
(74) *Attorney, Agent, or Firm* — Nicholson De Vos Webster & Elliott LLP

(57) ABSTRACT

A method is described for configuring a custom server processor including a base die and related components. For example, one embodiment includes: providing a secure website to a user for configuring a custom server processor, the secure website including a graphical user interface (GUI); providing a first graphical element from which a user is to select a base die and an associated package; providing a second graphical element including a plurality of building block options selectable by the user to populate landing slots in the selected base die; providing a third graphical element including a visual representation of a user configuration that includes one or more building blocks selected by the user in the second graphical element and arranged on the base die selected by the user in the first graphical element; and performing a verification of the user configuration.

15 Claims, 20 Drawing Sheets

Related U.S. Application Data division of application No. 14/498,353, filed on Sep. 26, 2014, now Pat. No. 9,514,093.

(51) Int. Cl.

| | |
|---|---|
| *H01L 25/065* | (2006.01) |
| *H01L 23/48* | (2006.01) |
| *H01L 23/544* | (2006.01) |
| *H01L 25/00* | (2006.01) |
| *G06F 12/1045* | (2016.01) |

(52) U.S. Cl.
CPC ........ *H01L 23/544* (2013.01); *H01L 25/0657* (2013.01); *H01L 25/50* (2013.01); *G06F 12/1045* (2013.01); *G06F 2212/1008* (2013.01); *G06F 2212/283* (2013.01); *G06F 2212/455* (2013.01); *G06F 2212/608* (2013.01); *G06F 2212/68* (2013.01); *H01L 2223/54426* (2013.01); *H01L 2225/06541* (2013.01); *H01L 2225/06593* (2013.01); *H01L 2924/0002* (2013.01)

(58) Field of Classification Search
CPC . H01L 2225/06541; G06T 7/75; G06F 30/12; G06F 30/20; G06F 30/33; G06F 30/34; G06F 30/347; G06F 30/392; G06F 2111/16; G06F 2117/08
See application file for complete search history.

(56) References Cited

U.S. PATENT DOCUMENTS

| | | | | |
|---|---|---|---|---|
| 2003/0131325 | A1* | 7/2003 | Schubert | ................. G06F 30/33 716/106 |
| 2004/0210855 | A1* | 10/2004 | Sanchez | ................. G06F 30/30 716/117 |
| 2009/0032928 | A1* | 2/2009 | Chiang | ................. H01L 23/481 257/686 |
| 2009/0174031 | A1 | 7/2009 | Wang et al. | |
| 2010/0023692 | A1 | 1/2010 | Jouppi | |
| 2011/0170266 | A1 | 7/2011 | Haensch et al. | |
| 2012/0175763 | A1 | 7/2012 | Harvey et al. | |
| 2012/0211885 | A1 | 8/2012 | Choi et al. | |
| 2013/0346695 | A1 | 12/2013 | Loh et al. | |
| 2014/0078704 | A1 | 3/2014 | Andry et al. | |
| 2015/0046612 | A1 | 2/2015 | Gupta | |
| 2015/0143037 | A1 | 5/2015 | Smith | |
| 2017/0062294 | A1 | 3/2017 | Nasrullah et al. | |

OTHER PUBLICATIONS

Final Office Action from U.S. Appl. No. 14/498,353, dated Feb. 8, 2016, 18 pages.

Final Office Action from U.S. Appl. No. 15/370,904, dated Nov. 13, 2017, 17 pages.

Non-Final Office Action from U.S. Appl. No. 14/498,353, dated Aug. 14, 2015, 18 pages.

Non-Final Office Action from U.S. Appl. No. 15/370,904, dated Jul. 26, 2018, 12 pages.

Non-Final Office Action from U.S. Appl. No. 15/370,904, dated May 9, 2017, 19 pages.

Notice of Allowance from U.S. Appl. No. 15/370,904, dated May 30, 2019, 7 pages.

Notice of Allowance from U.S. Appl. No. 14/498,353, dated Aug. 12, 2016, 11 pages.

Requirement for Restriction/Election from U.S. Appl. No. 14/498,353, dated May 1, 2015, 7 pages.

* cited by examiner

US 10,923,463 B2

METHOD AND MACHINE-READABLE MEDIUM FOR CONFIGURING PROCESSORS WITH BASE DIES HAVING LANDING SLOTS

BACKGROUND

Field of the Invention

This invention relates generally to the field of computer processors. More particularly, the invention relates to a method and apparatus for stacking a plurality of cores.

Description of the Related Art

Server processors include multiple product variants with a different number of compute cores and various amounts of L3 cache. For example, current server processors under development have three different die (15, 10 and 6 cores) and six different packages. Each die requires a separate tapeout and subsequent steppings, while each package requires a separate design and qualification effort. Finally, keeping all of these product variants in inventory and matching them with the actual demand carries a significant overhead.

At the same time, there is a need for even more specialized processors that meet specific workload requirements by combining different compute units on a single ring/mesh interface and unified L3 cache. Some processor customers require graphics units to support intensive computations, while others would like accelerators to be integrated for frequently executed functions, or a field-programmable gate-array (FPGA) to allow them to customize the server with their own logic design.

Some processor customers (e.g., in the high-performance computing market) prefer fewer cores that run at higher frequencies with the largest available L3 caches. To satisfy this market, a large number of cores (e.g., 15->6 cores) may be disabled on high core count (HCC) processors. While a small number of these parts are recovered from the units with defective cores, a significant amount of good cores are wasted by being permanently disabled.

BRIEF DESCRIPTION OF THE DRAWINGS

A better understanding of the present invention can be obtained from the following detailed description in conjunction with the following drawings, in which.

DETAILED DESCRIPTION

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Exemplary Processor Architectures and Data Types

Figure 1:
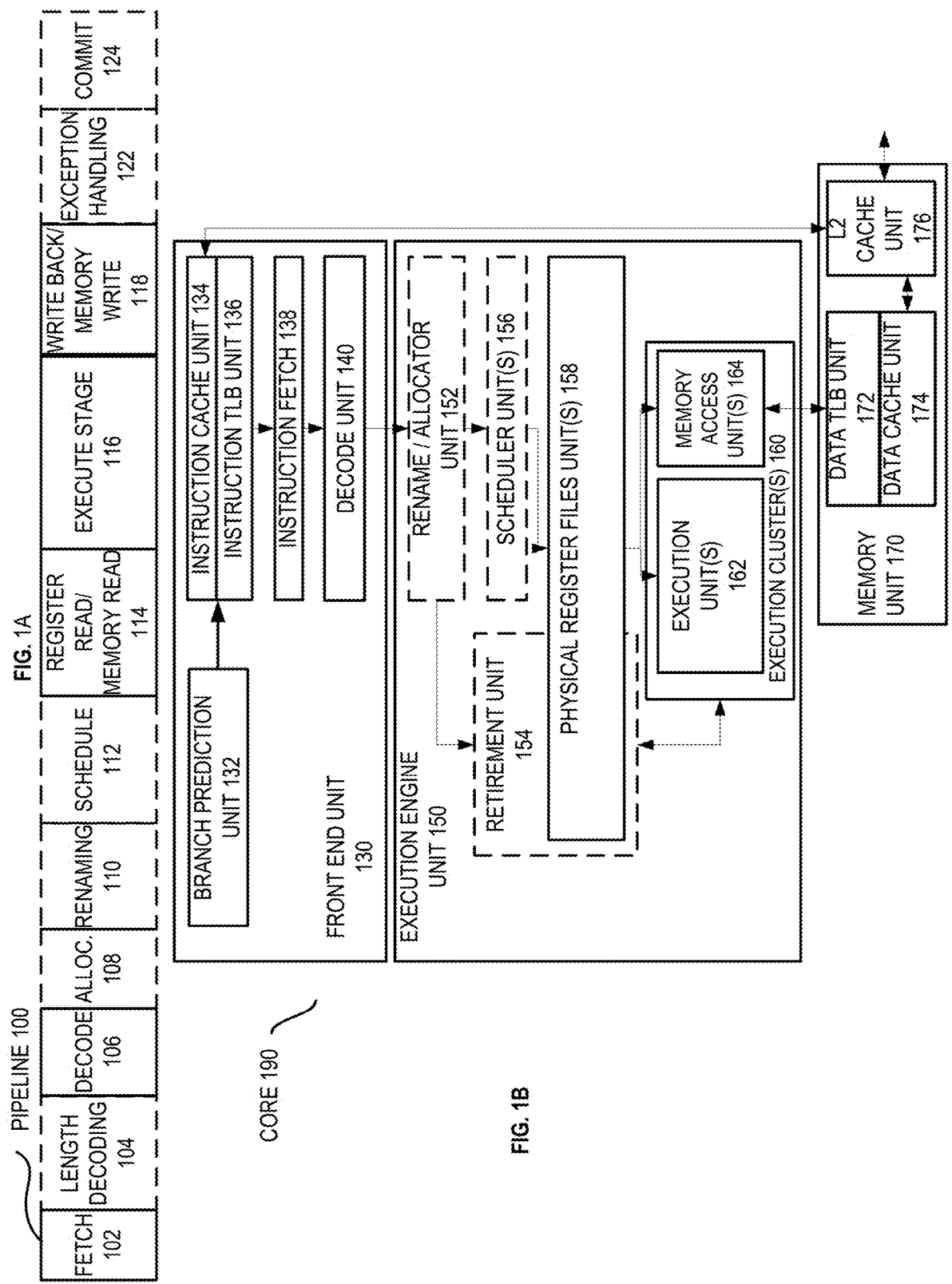
FIG. 1A is a block diagram illustrating both an exemplary in-order fetch, decode, retire pipeline and an exemplary register renaming, out-of-order issue/execution pipeline according to embodiments of the invention.
FIG. 1B is a block diagram illustrating both an exemplary embodiment of an in-order fetch, decode, retire core and an exemplary register renaming, out-of-order issue/execution architecture core to be included in a processor according to embodiments of the invention.

FIG. 1A is a block diagram illustrating both an exemplary in-order fetch, decode, retire pipeline and an exemplary register renaming, out-of-order issue/execution pipeline according to embodiments of the invention. FIG. 1B is a block diagram illustrating both an exemplary embodiment of an in-order fetch, decode, retire core and an exemplary register renaming, out-of-order issue/execution architecture core to be included in a processor according to embodiments of the invention. The solid lined boxes in FIGS. 1A-B illustrate the in-order portions of the pipeline and core, while the optional addition of the dashed lined boxes illustrates the register renaming, out-of-order issue/execution pipeline and core.

In FIG. 1A, a processor pipeline 100 includes a fetch stage 102, a length decode stage 104, a decode stage 106, an allocation stage 108, a renaming stage 110, a scheduling (also known as a dispatch or issue) stage 112, a register read/memory read stage 114, an execute stage 116, a write back/memory write stage 118, an exception handling stage 122, and a commit stage 124.

FIG. 1B shows processor core 190 including a front end unit 130 coupled to an execution engine unit 150, and both are coupled to a memory unit 170. The core 190 may be a reduced instruction set computing (RISC) core, a complex instruction set computing (CISC) core, a very long instruction word (VLIW) core, or a hybrid or alternative core type. As yet another option, the core 190 may be a special-purpose core, such as, for example, a network or communication core, compression engine, coprocessor core, general purpose computing graphics processing unit (GPGPU) core, graphics core, or the like.

The front end unit 130 includes a branch prediction unit 132 coupled to an instruction cache unit 134, which is coupled to an instruction translation lookaside buffer (TLB) 136, which is coupled to an instruction fetch unit 138, which is coupled to a decode unit 140. The decode unit 140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 190 includes a microcode ROM or other medium that stores microcode for certain macroinstructions (e.g., in decode unit 140 or otherwise within the front end unit 130). The decode unit 140 is coupled to a rename/allocator unit 152 in the execution engine unit 150.

The execution engine unit 150 includes the rename/allocator unit 152 coupled to a retirement unit 154 and a set of one or more scheduler unit(s) 156. The scheduler unit(s) 156 represents any number of different schedulers, including reservations stations, central instruction window, etc. The scheduler unit(s) 156 is coupled to the physical register file(s) unit(s) 158. Each of the physical register file(s) units 158 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 158 comprises a vector registers unit, a write mask registers unit, and a scalar registers unit. These register units may provide architectural vector registers, vector mask registers, and general purpose registers. The physical register file(s) unit(s) 158 is overlapped by the retirement unit 154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 154 and the physical register file(s) unit(s) 158 are coupled to the execution cluster(s) 160. The execution cluster(s) 160 includes a set of one or more execution units 162 and a set of one or more memory access units 164. The execution units 162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 156, physical register file(s) unit(s) 158, and execution cluster(s) 160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 164). It should also be understood that where separate pipelines are used, one or more of these pipelines may be out-of-order issue/execution and the rest in-order.

The set of memory access units 164 is coupled to the memory unit 170, which includes a data TLB unit 172 coupled to a data cache unit 174 coupled to a level 2 (L2) cache unit 176. In one exemplary embodiment, the memory access units 164 may include a load unit, a store address unit, and a store data unit, each of which is coupled to the data TLB unit 172 in the memory unit 170. The instruction cache unit 134 is further coupled to a level 2 (L2) cache unit 176 in the memory unit 170. The L2 cache unit 176 is coupled to one or more other levels of cache and eventually to a main memory.

By way of example, the exemplary register renaming, out-of-order issue/execution core architecture may implement the pipeline 100 as follows: 1) the instruction fetch 138 performs the fetch and length decoding stages 102 and 104; 2) the decode unit 140 performs the decode stage 106; 3) the rename/allocator unit 152 performs the allocation stage 108 and renaming stage 110; 4) the scheduler unit(s) 156 performs the schedule stage 112; 5) the physical register file(s) unit(s) 158 and the memory unit 170 perform the register read/memory read stage 114; the execution cluster 160 perform the execute stage 116; 6) the memory unit 170 and the physical register file(s) unit(s) 158 perform the write back/memory write stage 118; 7) various units may be involved in the exception handling stage 122; and 8) the retirement unit 154 and the physical register file(s) unit(s) 158 perform the commit stage 124.

The core 190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 190 includes logic to support a packed data instruction set extension (e.g., AVX1, AVX2, and/or some form of the generic vector friendly instruction format (U=0 and/or U=1), described below), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 134/174 and a shared L2 cache unit 176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 2:
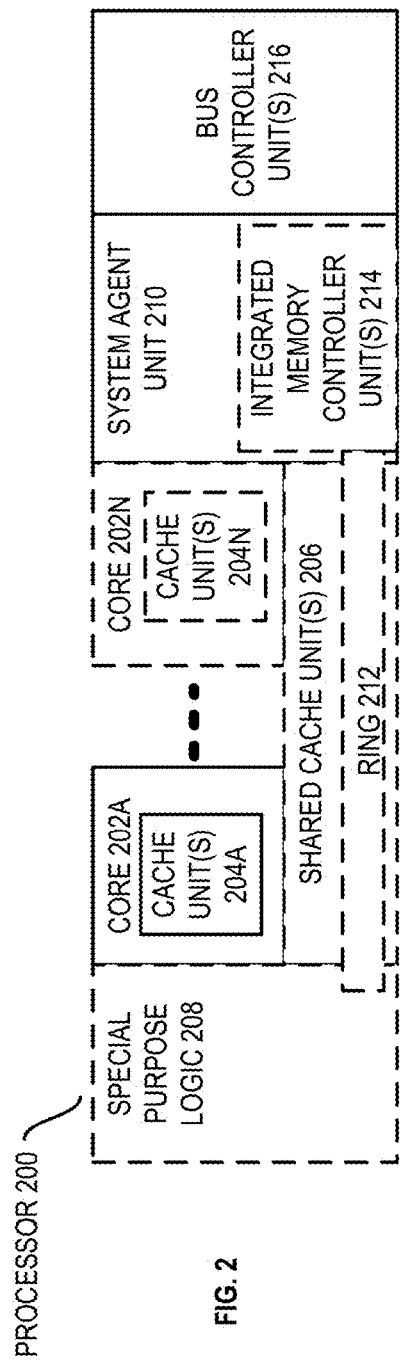
FIG. 2 is a block diagram of a single core processor and a multicore processor with integrated memory controller and graphics according to embodiments of the invention.

FIG. 2 is a block diagram of a processor 200 that may have more than one core, may have an integrated memory controller, and may have integrated graphics according to embodiments of the invention. The solid lined boxes in FIG. 2 illustrate a processor 200 with a single core 202A, a system agent 210, a set of one or more bus controller units 216, while the optional addition of the dashed lined boxes illustrates an alternative processor 200 with multiple cores 202A-N, a set of one or more integrated memory controller unit(s) 214 in the system agent unit 210, and special purpose logic 208.

Thus, different implementations of the processor 200 may include: 1) a CPU with the special purpose logic 208 being integrated graphics and/or scientific (throughput) logic (which may include one or more cores), and the cores 202A-N being one or more general purpose cores (e.g., general purpose in-order cores, general purpose out-of-order cores, a combination of the two); 2) a coprocessor with the cores 202A-N being a large number of special purpose cores intended primarily for graphics and/or scientific (throughput); and 3) a coprocessor with the cores 202A-N being a large number of general purpose in-order cores. Thus, the processor 200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 206, and external memory (not shown) coupled to the set of integrated memory controller units 214. The set of shared cache units 206 may include one or more mid-level caches, such as level 2 (L2), level 3 (L3), level 4 (L4), or other levels of cache, a last level cache (LLC), and/or combinations thereof. While in one embodiment a ring based interconnect unit 212 interconnects the integrated graphics logic 208, the set of shared cache units 206, and the system agent unit 210/integrated memory controller unit(s) 214, alternative embodiments may use any number of well-known techniques for interconnecting such units. In one embodiment, coherency is maintained between one or more cache units 206 and cores 202-A-N.

In some embodiments, one or more of the cores 202A-N are capable of multithreading. The system agent 210 includes those components coordinating and operating cores 202A-N. The system agent unit 210 may include for example a power control unit (PCU) and a display unit. The PCU may be or include logic and components needed for regulating the power state of the cores 202A-N and the integrated graphics logic 208. The display unit is for driving one or more externally connected displays.

The cores 202A-N may be homogenous or heterogeneous in terms of architecture instruction set; that is, two or more of the cores 202A-N may be capable of execution the same instruction set, while others may be capable of executing only a subset of that instruction set or a different instruction set. In one embodiment, the cores 202A-N are heterogeneous and include both the "small" cores and "big" cores described below.

FIGS. 3-6 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 3:
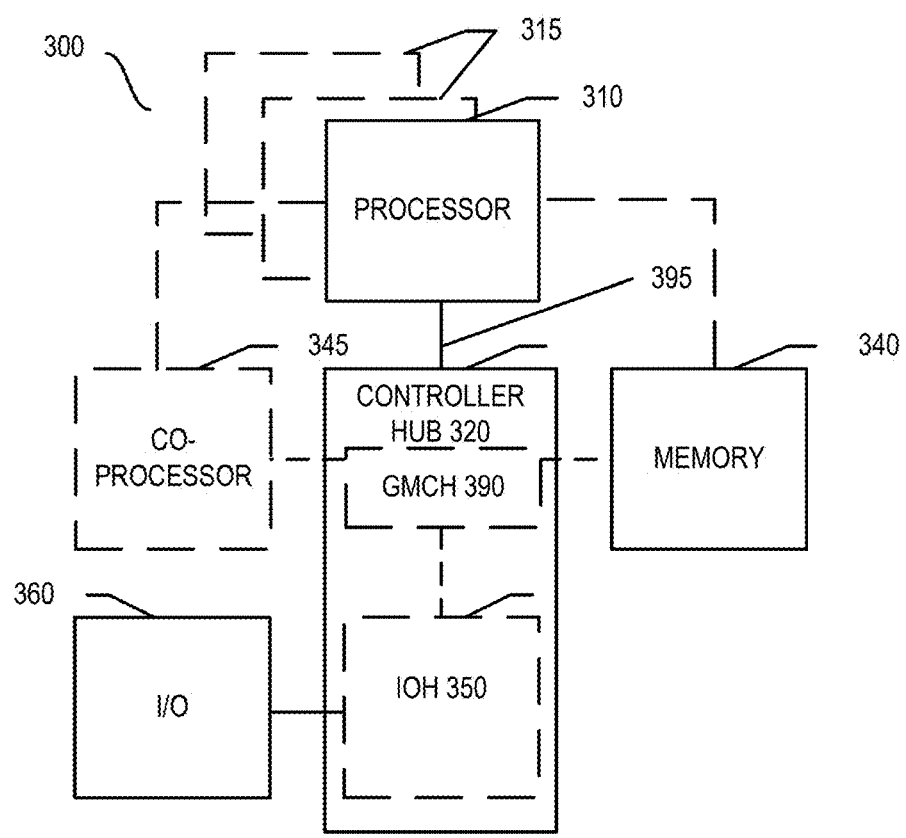
FIG. 3 illustrates a block diagram of a system in accordance with one embodiment of the present invention.

Referring now to FIG. 3, shown is a block diagram of a system 300 in accordance with one embodiment of the present invention. The system 300 may include one or more processors 310, 315, which are coupled to a controller hub 320. In one embodiment the controller hub 320 includes a graphics memory controller hub (GMCH) 390 and an Input/Output Hub (IOH) 350 (which may be on separate chips); the GMCH 390 includes memory and graphics controllers to which are coupled memory 340 and a coprocessor 345; the IOH 350 is couples input/output (I/O) devices 360 to the GMCH 390. Alternatively, one or both of the memory and graphics controllers are integrated within the processor (as described herein), the memory 340 and the coprocessor 345 are coupled directly to the processor 310, and the controller hub 320 in a single chip with the IOH 350.

The optional nature of additional processors 315 is denoted in FIG. 3 with broken lines. Each processor 310, 315 may include one or more of the processing cores described herein and may be some version of the processor 200.

The memory 340 may be, for example, dynamic random access memory (DRAM), phase change memory (PCM), or a combination of the two. For at least one embodiment, the controller hub 320 communicates with the processor(s) 310, 315 via a multi-drop bus, such as a frontside bus (FSB), point-to-point interface such as QuickPath Interconnect (QPI), or similar connection 395.

In one embodiment, the coprocessor 345 is a special-purpose processor, such as, for example, a high-throughput MIC processor, a network or communication processor, compression engine, graphics processor, GPGPU, embedded processor, or the like. In one embodiment, controller hub 320 may include an integrated graphics accelerator.

There can be a variety of differences between the physical resources 310, 315 in terms of a spectrum of metrics of merit including architectural, microarchitectural, thermal, power consumption characteristics, and the like.

In one embodiment, the processor 310 executes instructions that control data processing operations of a general type. Embedded within the instructions may be coprocessor instructions. The processor 310 recognizes these coprocessor instructions as being of a type that should be executed by the attached coprocessor 345. Accordingly, the processor 310 issues these coprocessor instructions (or control signals representing coprocessor instructions) on a coprocessor bus or other interconnect, to coprocessor 345. Coprocessor(s) 345 accept and execute the received coprocessor instructions.

Figure 4:
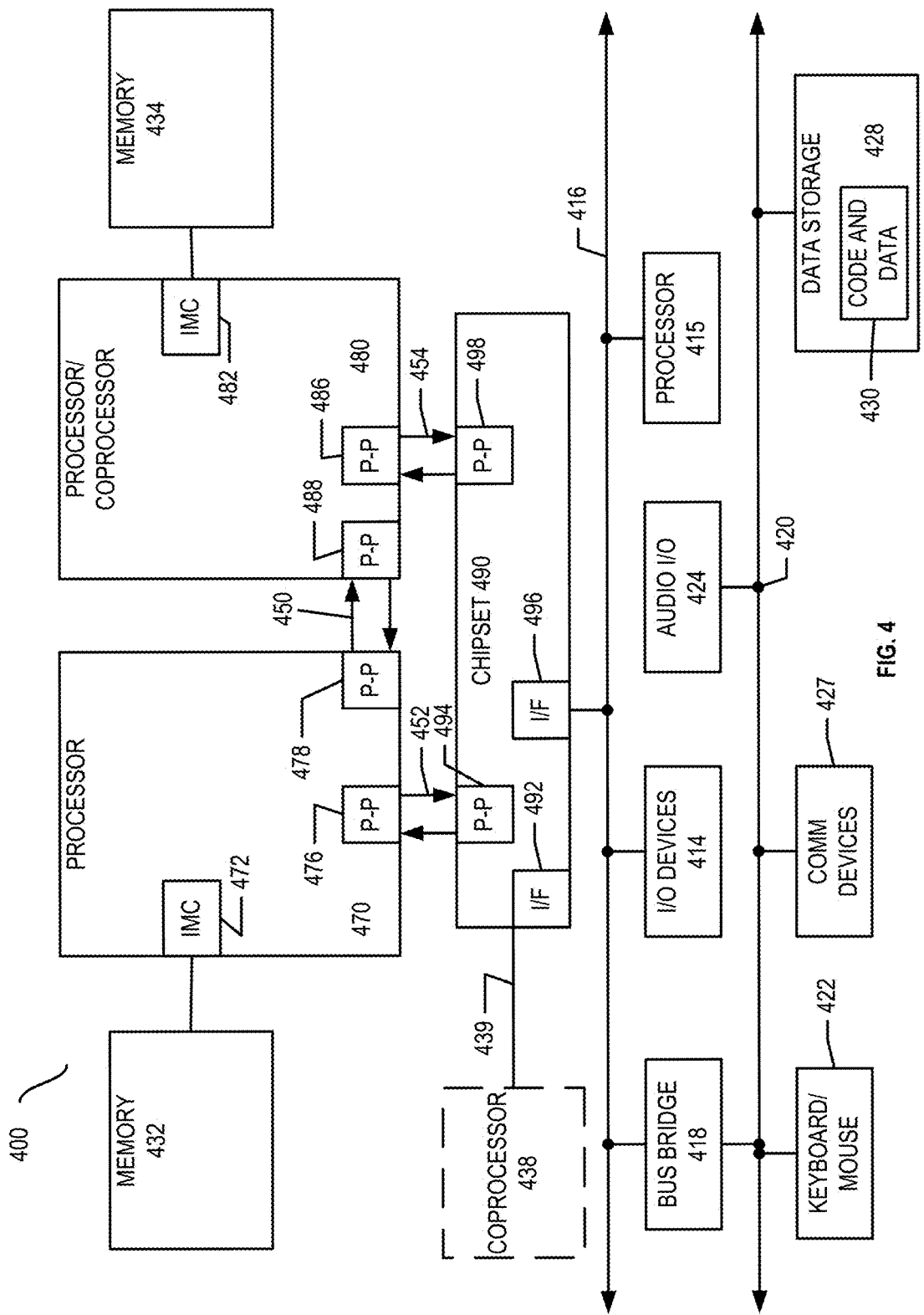
FIG. 4 illustrates a block diagram of a second system in accordance with an embodiment of the present invention.

Referring now to FIG. 4, shown is a block diagram of a first more specific exemplary system 400 in accordance with an embodiment of the present invention. As shown in FIG. 4, multiprocessor system 400 is a point-to-point interconnect system, and includes a first processor 470 and a second processor 480 coupled via a point-to-point interconnect 450. Each of processors 470 and 480 may be some version of the processor 200. In one embodiment of the invention, processors 470 and 480 are respectively processors 310 and 315, while coprocessor 438 is coprocessor 345. In another embodiment, processors 470 and 480 are respectively processor 310 coprocessor 345.

Processors 470 and 480 are shown including integrated memory controller (IMC) units 472 and 482, respectively. Processor 470 also includes as part of its bus controller units point-to-point (P-P) interfaces 476 and 478; similarly, second processor 480 includes P-P interfaces 486 and 488. Processors 470, 480 may exchange information via a point-to-point (P-P) interface 450 using P-P interface circuits 478, 488. As shown in FIG. 4, IMCs 472 and 482 couple the processors to respective memories, namely a memory 432 and a memory 434, which may be portions of main memory locally attached to the respective processors.

Processors 470, 480 may each exchange information with a chipset 490 via individual P-P interfaces 452, 454 using point to point interface circuits 476, 494, 486, 498. Chipset 490 may optionally exchange information with the coprocessor 438 via a high-performance interface 439. In one embodiment, the coprocessor 438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 490 may be coupled to a first bus 416 via an interface 496. In one embodiment, first bus 416 may be a Peripheral Component Interconnect (PCI) bus, or a bus such as a PCI Express bus or another third generation I/O interconnect bus, although the scope of the present invention is not so limited.

As shown in FIG. 4, various I/O devices 414 may be coupled to first bus 416, along with a bus bridge 418 which couples first bus 416 to a second bus 420. In one embodiment, one or more additional processor(s) 415, such as coprocessors, high-throughput MIC processors, GPGPU's, accelerators (such as, e.g., graphics accelerators or digital signal processing (DSP) units), field programmable gate arrays, or any other processor, are coupled to first bus 416. In one embodiment, second bus 420 may be a low pin count (LPC) bus. Various devices may be coupled to a second bus 420 including, for example, a keyboard and/or mouse 422, communication devices 427 and a storage unit 428 such as a disk drive or other mass storage device which may include instructions/code and data 430, in one embodiment. Further, an audio I/O 424 may be coupled to the second bus 420. Note that other architectures are possible. For example, instead of the point-to-point architecture of FIG. 4, a system may implement a multi-drop bus or other such architecture.

Figure 5:
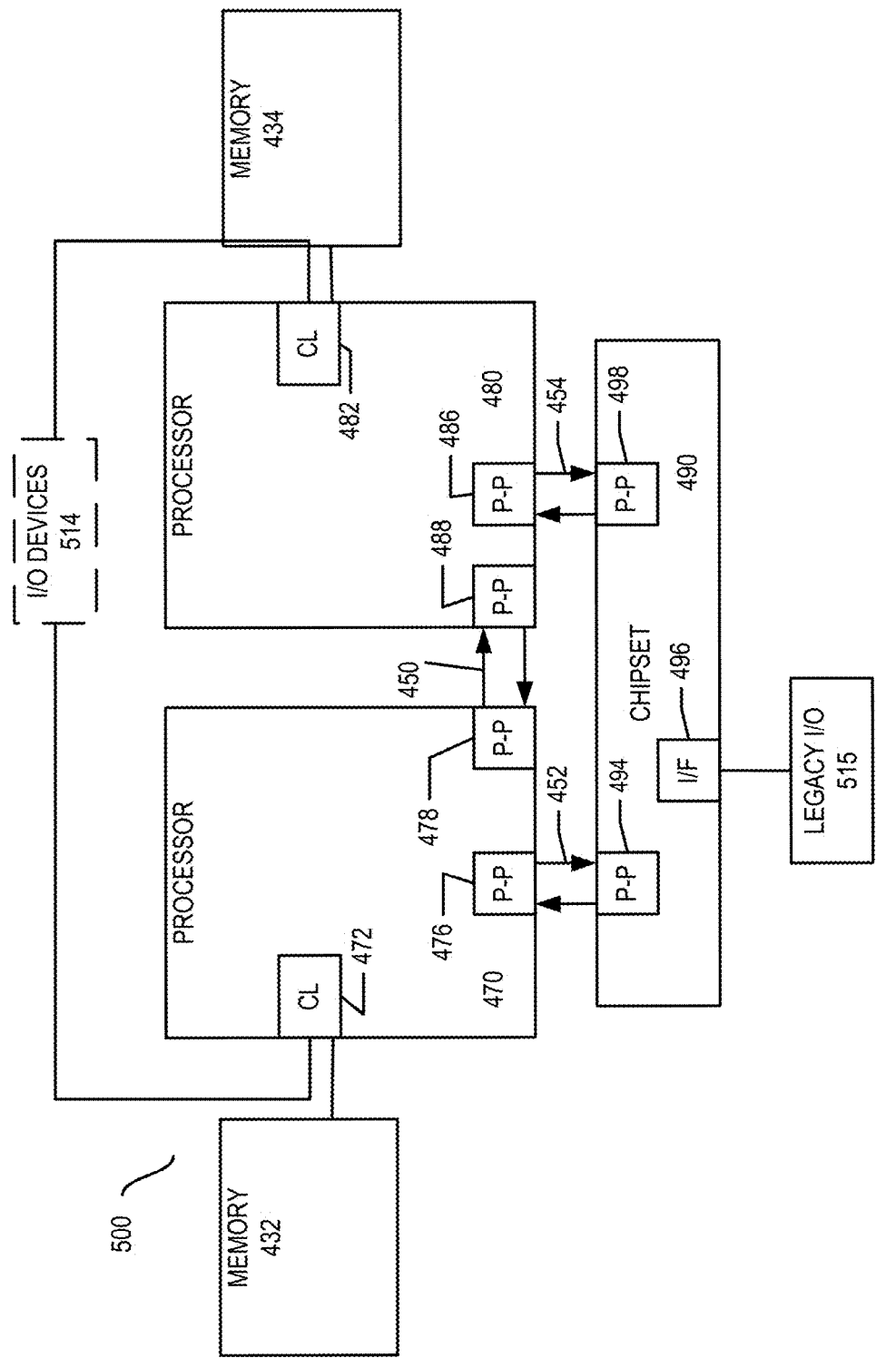
FIG. 5 illustrates a block diagram of a third system in accordance with an embodiment of the present invention.

Referring now to FIG. 5, shown is a block diagram of a second more specific exemplary system 500 in accordance with an embodiment of the present invention. Like elements in FIGS. 4 and 5 bear like reference numerals, and certain aspects of FIG. 4 have been omitted from FIG. 5 in order to avoid obscuring other aspects of FIG. 5.

FIG. 5 illustrates that the processors 470, 480 may include integrated memory and I/O control logic ("CL") 472 and 482, respectively. Thus, the CL 472, 482 include integrated memory controller units and include I/O control logic. FIG. 5 illustrates that not only are the memories 432, 434 coupled to the CL 472, 482, but also that I/O devices 514 are also coupled to the control logic 472, 482. Legacy I/O devices 515 are coupled to the chipset 490.

Figure 6:
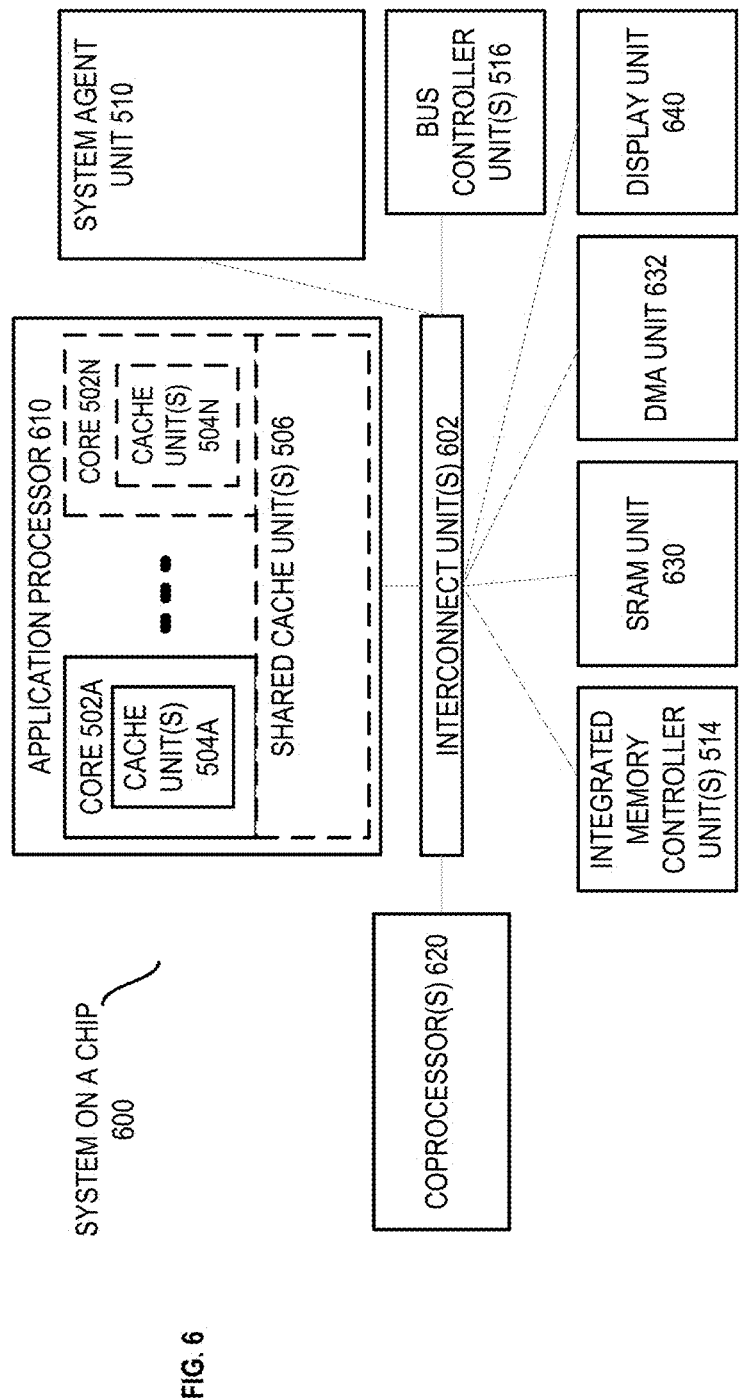
FIG. 6 illustrates a block diagram of a system on a chip (SoC) in accordance with an embodiment of the present invention.

Referring now to FIG. 6, shown is a block diagram of a SoC 600 in accordance with an embodiment of the present invention. Similar elements in FIG. 2 bear like reference numerals. Also, dashed lined boxes are optional features on more advanced SoCs. In FIG. 6, an interconnect unit(s) 602 is coupled to: an application processor 610 which includes a set of one or more cores 202A-N and shared cache unit(s) 206; a system agent unit 210; a bus controller unit(s) 216; an integrated memory controller unit(s) 214; a set or one or more coprocessors 620 which may include integrated graphics logic, an image processor, an audio processor, and a video processor; an static random access memory (SRAM) unit 630; a direct memory access (DMA) unit 632; and a display unit 640 for coupling to one or more external displays. In one embodiment, the coprocessor(s) 620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 430 illustrated in FIG. 4, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 7:
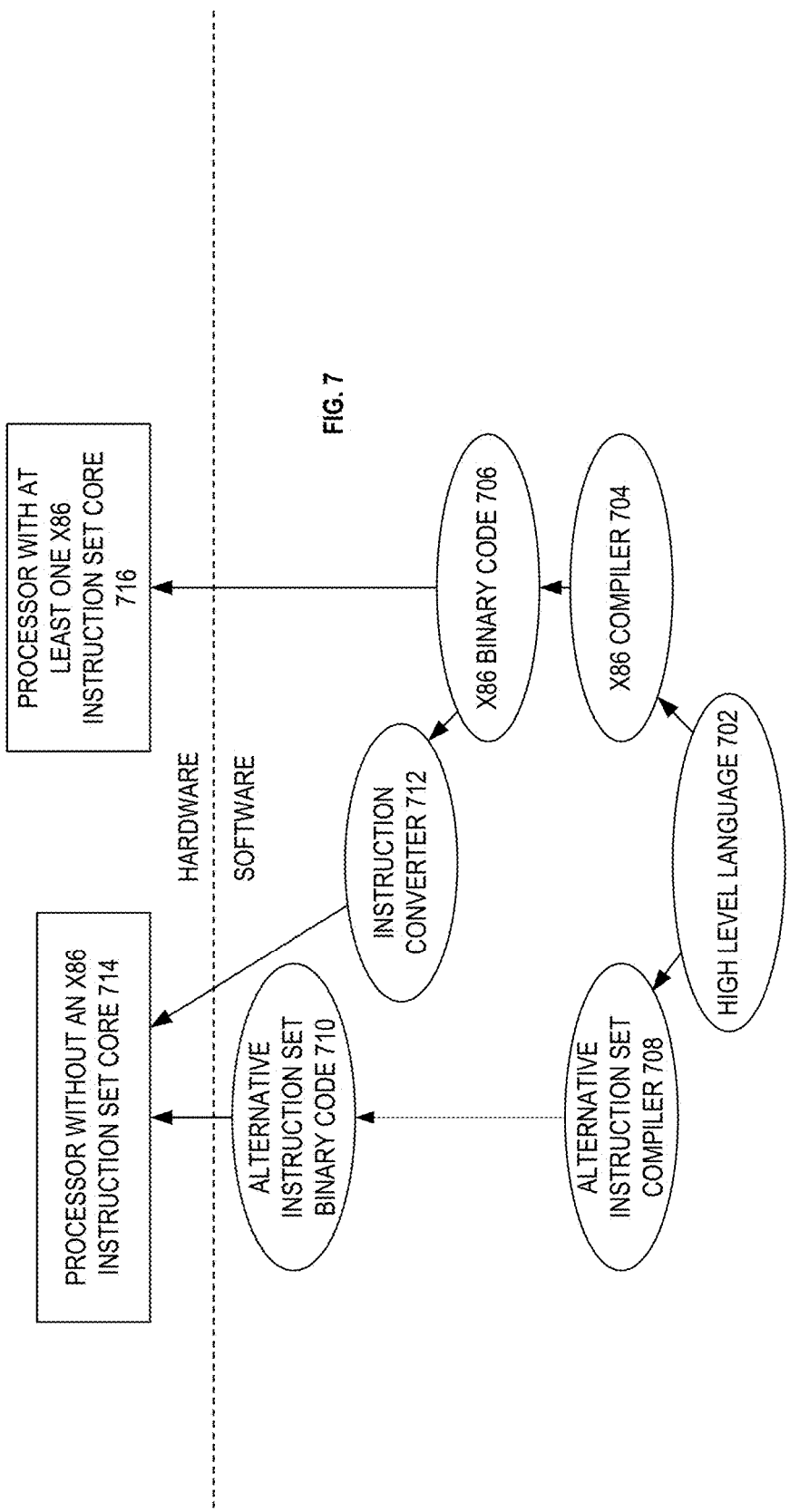
FIG. 7 illustrates a block diagram contrasting the use of a software instruction converter to convert binary instructions in a source instruction set to binary instructions in a target instruction set according to embodiments of the invention.

FIG. 7 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 7 shows a program in a high level language 702 may be compiled using an x86 compiler 704 to generate x86 binary code 706 that may be natively executed by a processor with at least one x86 instruction set core 716. The processor with at least one x86 instruction set core 716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 704 represents a compiler that is operable to generate x86 binary code 706 (e.g., object code) that can, with or without additional linkage processing, be executed on the processor with at least one x86 instruction set core 716. Similarly, FIG. 7 shows the program in the high level language 702 may be compiled using an alternative instruction set compiler 708 to generate alternative instruction set binary code 710 that may be natively executed by a processor without at least one x86 instruction set core 714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 712 is used to convert the x86 binary code 706 into code that may be natively executed by the processor without an x86 instruction set core 714. This converted code is not likely to be the same as the alternative instruction set binary code 710 because an instruction converter capable of this is difficult to make; however, the converted code will accomplish the general operation and be made up of instructions from the alternative instruction set. Thus, the instruction converter 712 represents software, firmware, hardware, or a combination thereof that, through emulation, simulation or any other process, allows a processor or other electronic device that does not have an x86 instruction set processor or core to execute the x86 binary code 706.

Method and Apparatus for Stacking a Plurality of Cores

The embodiments of the invention described below include a modular server processor assembly that enables multiple core count options without requiring a new tapeout and package for each distinct product. The core count may be determined at the assembly time thereby reducing inventory and time-to-market. In addition, the described embodiments provide the flexibility to build server processors with a combination of big cores (e.g., Intel Core® cores), small cores (e.g., Intel Atom® cores), graphics units (e.g., for performing general purpose computing on graphics processing units (GPGPUs)), special purpose accelerators, and field programmable gate arrays (FPGAs), all using the same package.

Figure 8:
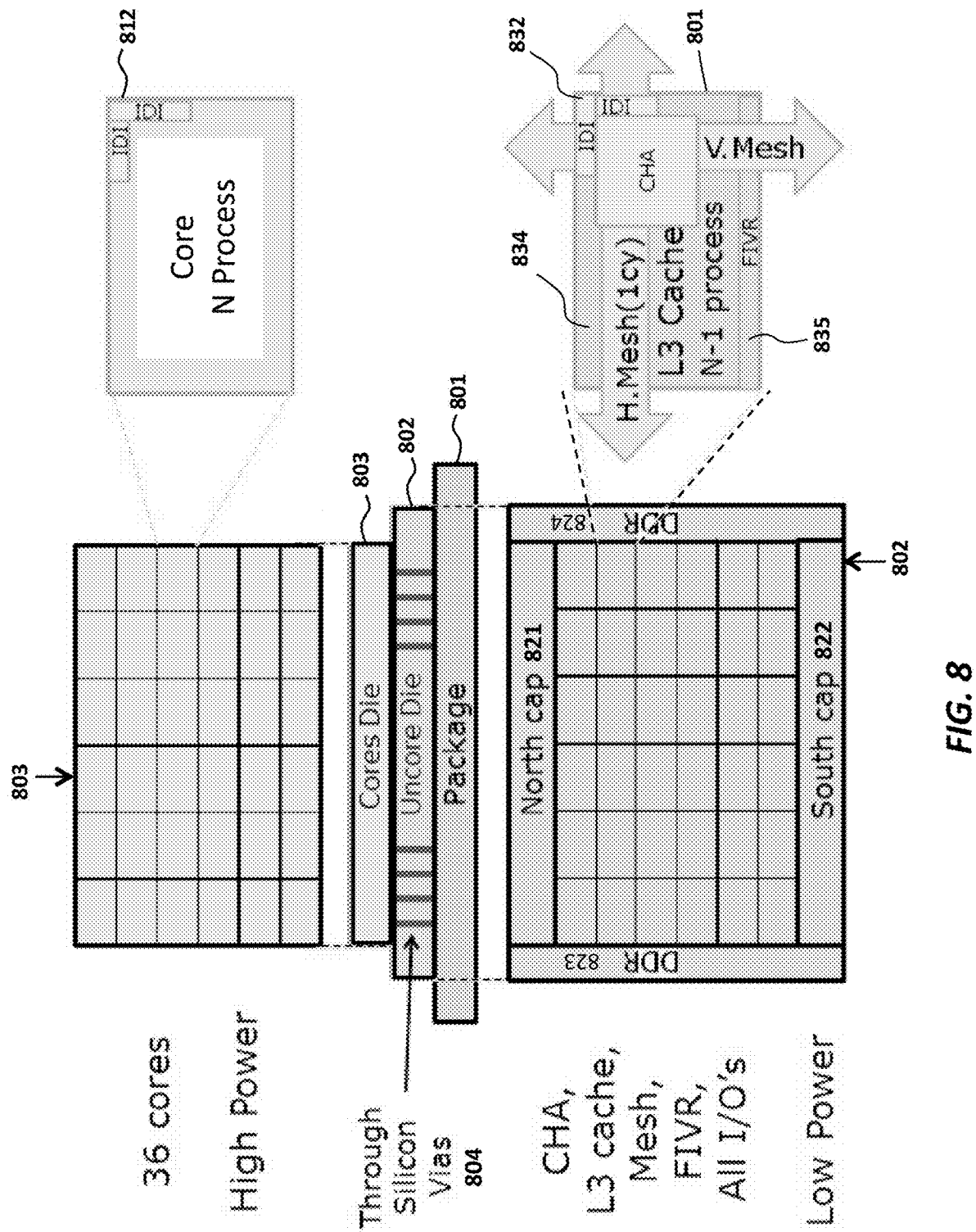
FIG. 8 illustrates one embodiment of the invention which splits a server processor into several different die.

As illustrated in FIG. 8, one embodiment of the invention splits the monolithic server processor into several different die 802-803 that will be 3D-stacked together on a package 801. The bottom die 802, sometimes referred to as the "uncore" die, contains all the I/O interfaces, mesh or ring interconnects and routers/arbiters (e.g., integrated home agent and caching agent (Cbo)), L3 cache 834, power management and fully-integrated voltage regulators (FIVR) 835. In one embodiment, this bottom die 802 mounts directly on the package 801 and has a number of landing slots that can be used to connect vertically to big cores (Core®), small cores (Atom®), graphics units (units for performing GPGPU), accelerators and FPGAs.

In one embodiment, all vertical connections are made using Through-Silicon-Vias (TSVs) 804 within the bottom die 802 and a modular logic interface, called the Inter-Die-Interface (IDI) 812, 832, a first portion of which 812 is formed within each core and a second portion of which 832 is formed within the uncore die 802. In one embodiment, the top cores 803 are laid out in an array and processed on sea-of-cores wafers. The number of cores of each type is determined by how those wafers are cut (sawed). For example, FIG. 8 shows a simple implementation of this idea, using a particular server processor for illustration. The largest core count part (36 cores in this example) will use a 6×6 array of cores 803 cut from the wafer as a single die. However, the underlying principles of the invention are not limited to any particular number of cores. For example, in one embodiment, the top cores 803 may include, for example, only 8 cores, cut from the same wafer in 2×4 arrays. This enables many possible core counts using different core count blocks cut from an array of identical cores 803 on the wafer using the same package 801 and bottom die 802. As illustrated in FIG. 8, the uncore die 802 may also include a north cap 821 and south cap 822 (described below) as well as dedicated double-data rate (DDR) memory and/or memory interfaces 823-824.

In contrast to the embodiment shown in FIG. 8, existing server processors are monolithic designs and require a new tapeout and subsequent steppings for each core count die option. Usually, the largest die is built first and then it is "chopped" to obtain the lower core count processors. Since each die has a different size, each chop requires a new package design, even if they all fit in the same socket and platform. The embodiments of the invention re-use the same bottom (uncore) die 802 and package 801, to provide many core count options. Since two smaller die have better yields than one large, monolithic die, these embodiments provide a significant cost reduction. Estimates show a cost savings of up to $350M per server processor program depending on the configuration used.

Another benefit of this embodiment is the reduced time-to-market for server processors. Since the bottom (uncore) die 802 may be in an older process technology (identified as an "N−1 process" in FIG. 8, in contrast to the current "N process" used for the cores), it can be designed well in advance and will not be impacted by the yield and modeling difficulties of bringing up the latest process technologies. When the client core design is ready, the sea-of-cores wafer can be built to introduce the server product to the market about 3-6 months after the client processor (in contrast to a time lag of over one year today).

These embodiments also improve the mesh latency and frequency, a significant contributor to the server overall performance. First, the mesh RC delays are lower in the older process technology. Second, the mesh is shorter since it now runs "underneath" the processor core, as opposed to "around" the processor core as in the existing monolithic implementations.

Finally, these embodiments of the invention allow multiple die mounted on the same bottom die, using different process technologies. For example, micro-server processors may be built using both even process (e.g., Core®) and odd process (Atom®) cores on top of the same uncore die 802 with integrated south complex and in the exact same package. Today's Core-based micro-server processors are in a side-by-side multi-chip package with the chipset since the processor is in the even process and the chipset in the odd process technology. By using the 3D-stacking method presented here, the micro-server die footprint is cut to less than half, enabling a smaller package size, a key requirement for the micro-server market. The embodiments of the invention also allow mixing processor cores, graphics sub-systems, accelerators and field-programmable gate arrays (FPGAs) in a modular fashion in the same uncore bottom die 802 and same package 801, as will be shown below.

Figure 9:
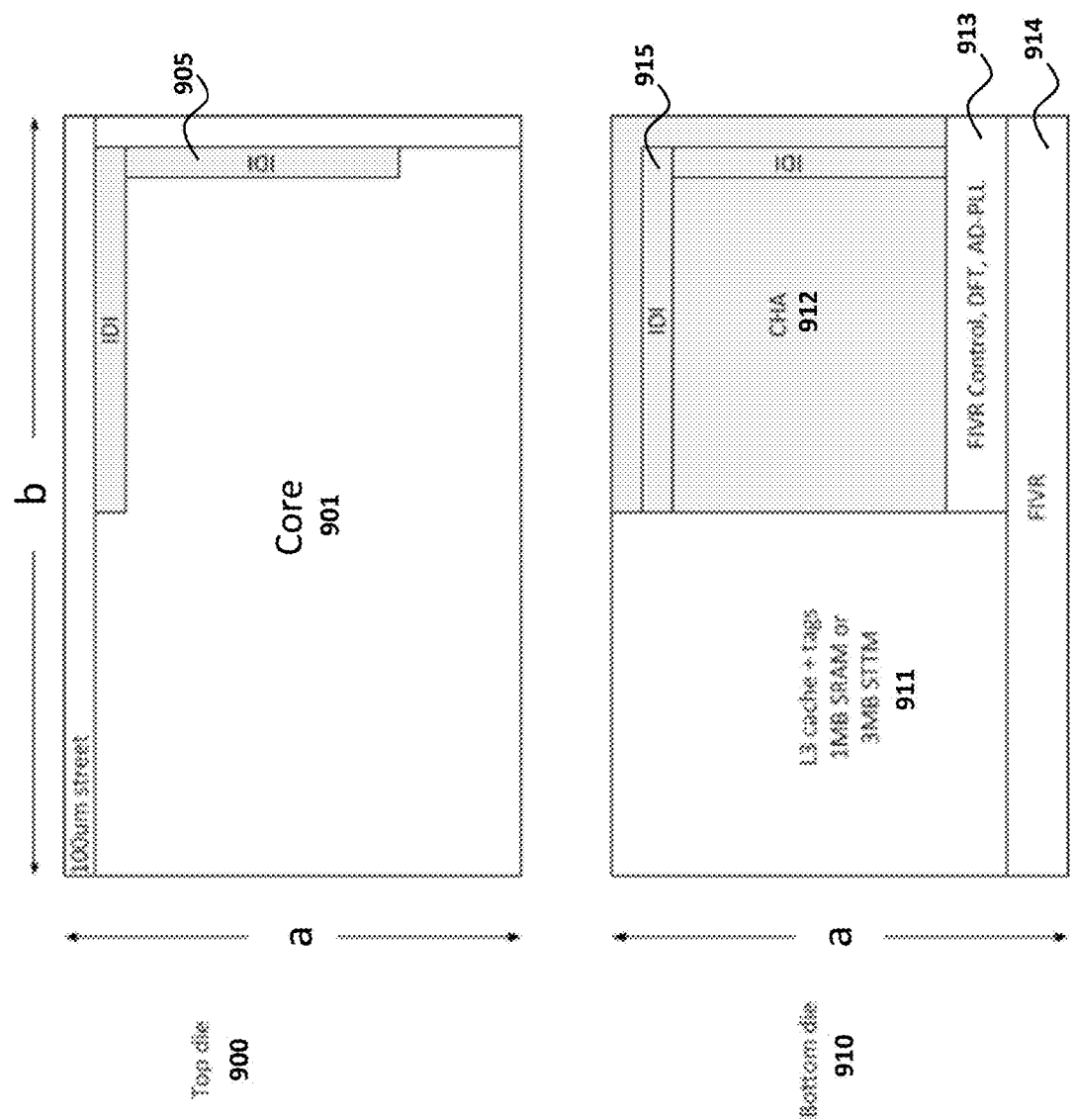
FIG. 9 illustrates building blocks for one exemplary embodiment including a top die using processor cores and a bottom die.

FIG. 9 shows the basic building blocks for one exemplary embodiment of the top die 900 using processor cores 901 and the bottom (uncore) die 910. In one embodiment, each core has a single width scribe line around it. The two die communicate through the Inter-Die Interface (IDI) 905, 915 and using the Through-Silicon Vias (TSVs) 804 (FIG. 8). Note that the footprint of the two slices on the top and bottom die, including the IDI 905, 915, match perfectly and align along the IDI micro-bumps. In one embodiment, there is no white space in either slice, with all remaining area on the bottom die allocated to the L3 cache 911. In this example, the core 901 is an exact copy of the client design, without any server extensions. In one embodiment, each uncore slice 910 supports a 1 MB L3 cache 911 using 6T static random access memory (SRAM) cells or 3 MB L3 cache using spin transfer torque memory (STTM) cells. If the core 901 includes server extensions (e.g., advanced vector extensions (AVX) and L2 extension), the uncore slice 910 can hold 1.5 MB L3 cache 911 using 6T SRAM or a 4.5 MB cache using STTM cells. Such an example is described below with respect to FIG. 17. Also shown in FIG. 9 is the Caching and Home Agent (CHA) component 912, FIVR control unit 913 and FIVR 914.

Figure 10:
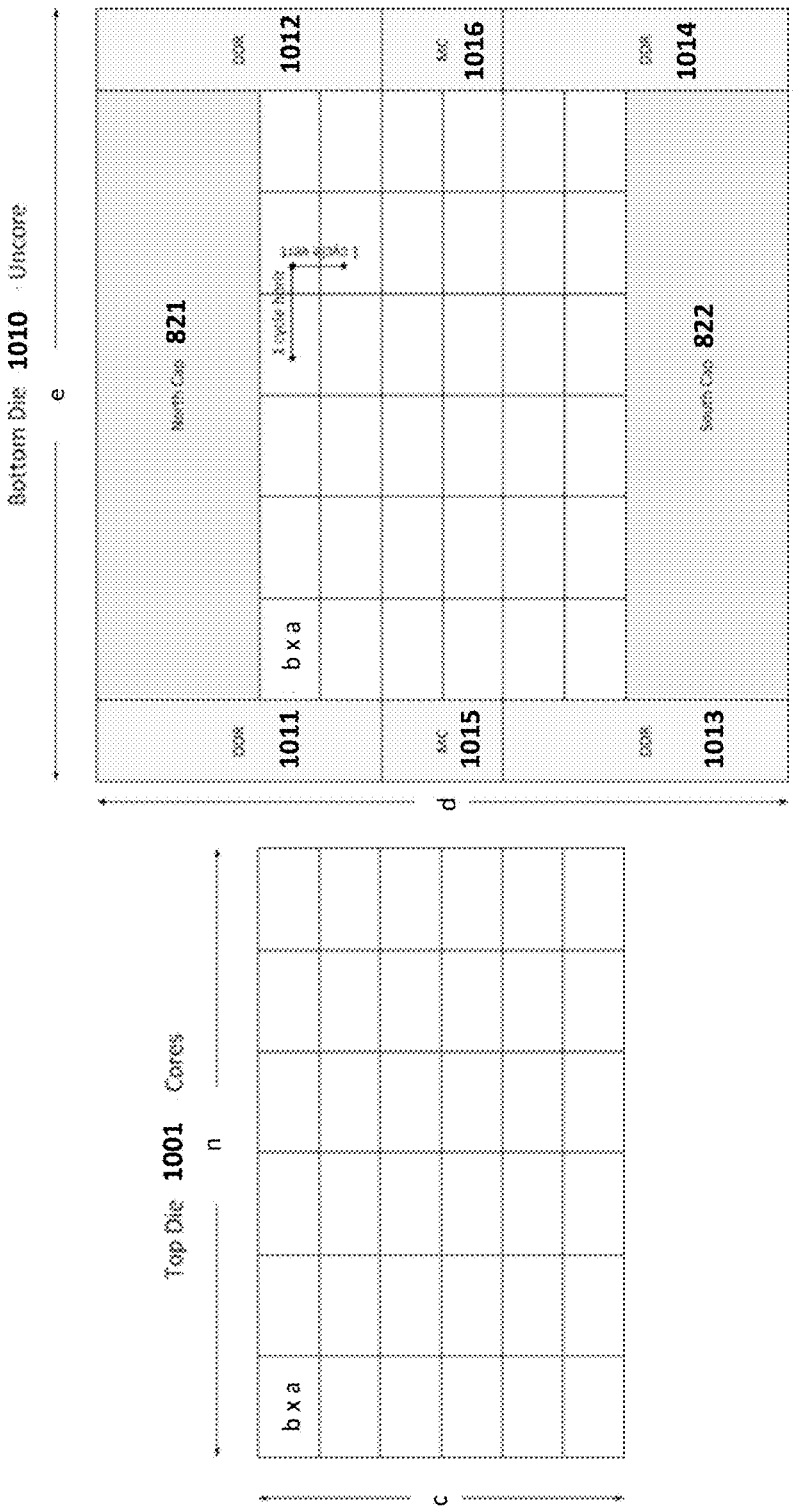
FIG. 10 illustrates a top die and bottom die of the server processor with 36 large cores.

FIG. 10 shows the top die 1001 and bottom die 1010 of the server processor with 36 "large" cores (e.g., server cores such as i7 cores and Xeon cores, etc) and 36 MB L3 cache. Note that in this embodiment the cores 1001 are on the top of the stack, to enable direct contact with the heat spreader, since about 60% of the total processor power is dissipated in the cores. The die containing the cores 1001 may be small to improve yield and minimize process bring-up issues. The bottom uncore die 1010 may (or may not) be an older process technology which will have excellent yields with all correlation and variation issues worked out by the time the core die process is introduced. The uncore die 1010 illustrated in FIG. 10 includes a set of DDR interfaces/memories 1011-1014, memory controllers (MCs) 1015-1016, and the north cap 821 and south cap 822 components. The north and south cap contain I/O interfaces, including but not limited to, PCI Express serial links, Quick Path Interconnect (QPI) serial links, general-purpose I/O as well as interfaces for in-package memory.

Figure 11:
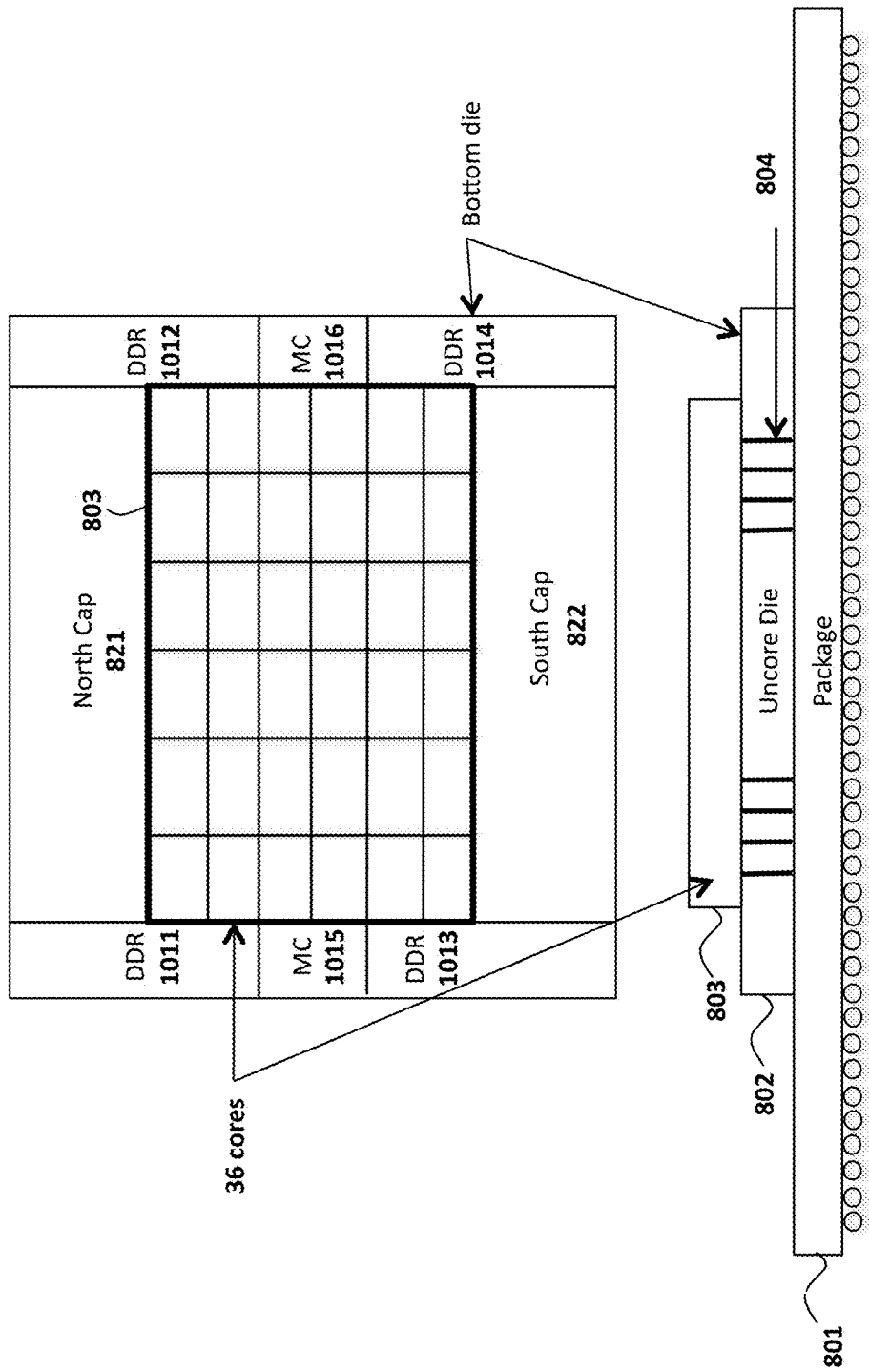
FIG. 11 illustrates the assembled stack including the package, uncore die, and cores die connected using through-silicon vias (TSVs) integrated in the uncore die.

FIG. 11 illustrates the assembled stack including the package 801, uncore die 802, and cores die 801 connected using through-silicon vias (TSVs) 804 integrated in the bottom uncore die 802. In one embodiment, TSVs are avoided in the newer process technology (e.g., TSVs are not used for the cores die 803 in one embodiment) to minimize the yield impact on the new process technology. The bottom uncore die 802 being in an older process technology can better support the TSV technology module addition, since the process is mature and well characterized. The illustrated embodiment also shows the DDR memory components 1011-1014, memory controllers 1015-1016, north cap 821, and south cap 822 integrated on the uncore die 802.

Figure 12:
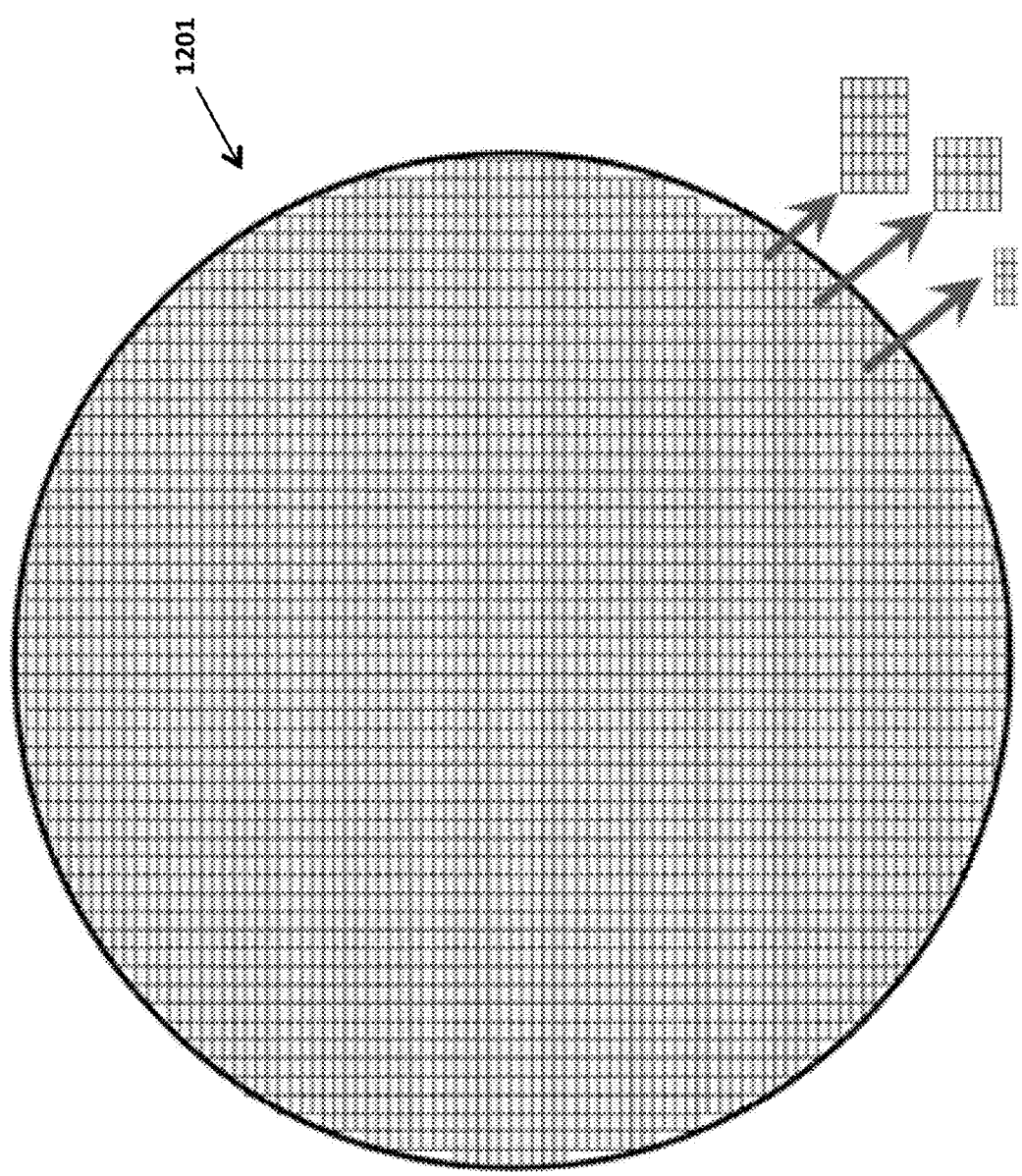
FIG. 12 illustrates the cores arrayed in a sea-of-cores configuration.

In one embodiment, the cores are arrayed in a sea-of-cores configuration on a wafer 1201 as shown in FIG. 12. The wafer 1201 may be sorted using a serial-link-triggered built-in self test (BIST) using only a few signal bumps and a small number of power and ground bumps. Each wafer 1201 is cut in a different way as illustrated, depending on the good die map, in order to maximize the product revenue from each wafer.

Figure 13:
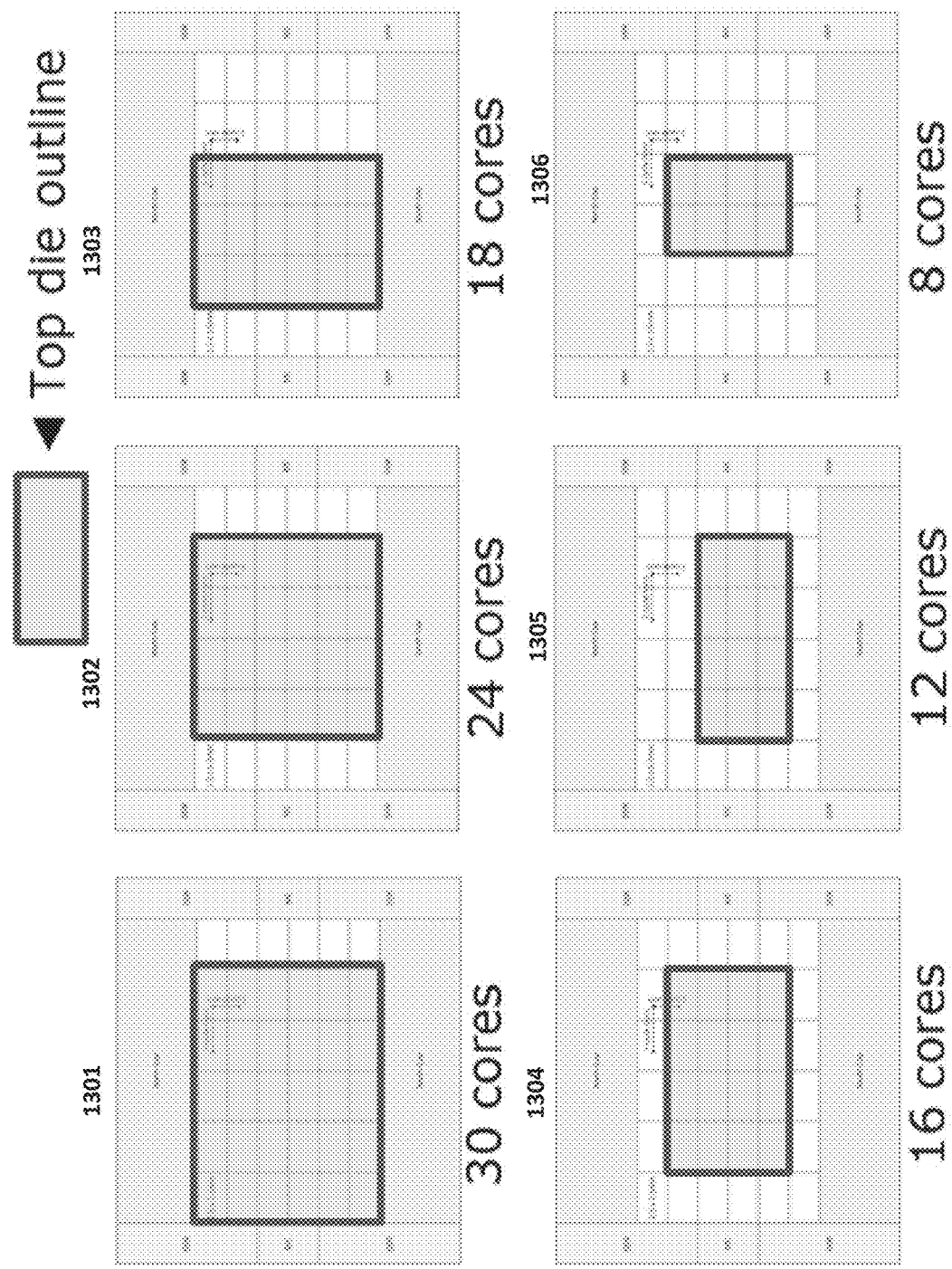
FIG. 13 illustrates one embodiment in which the bottom die provides a landing slot array to support a particular maximum number of cores.

In one embodiment, the bottom die provides a landing slot array to support a particular maximum number of cores (e.g., a 6×6 array for a 36 core top die). However, top dies containing smaller core counts may be coupled to a specified portion of the landing slot array. For example, as illustrated in FIG. 13, smaller core count configurations based on the 6×6 landing slot array on the bottom die as described herein include a 6×5 (Vertical×Horizontal) configuration 1301, a 6×4 configuration 1302, a 6×3 configuration 1303, a 4×4 configuration 1304, a 3×4 configuration 1305 and a 4×2 configuration 1306. All of these different core count processors may have the full 36 MB L3 cache and use the same bottom (uncore) die 802 and package 801. The low core count parts with the large L3 cache are ideal for the high-performance computing market segment.

Figure 14B:
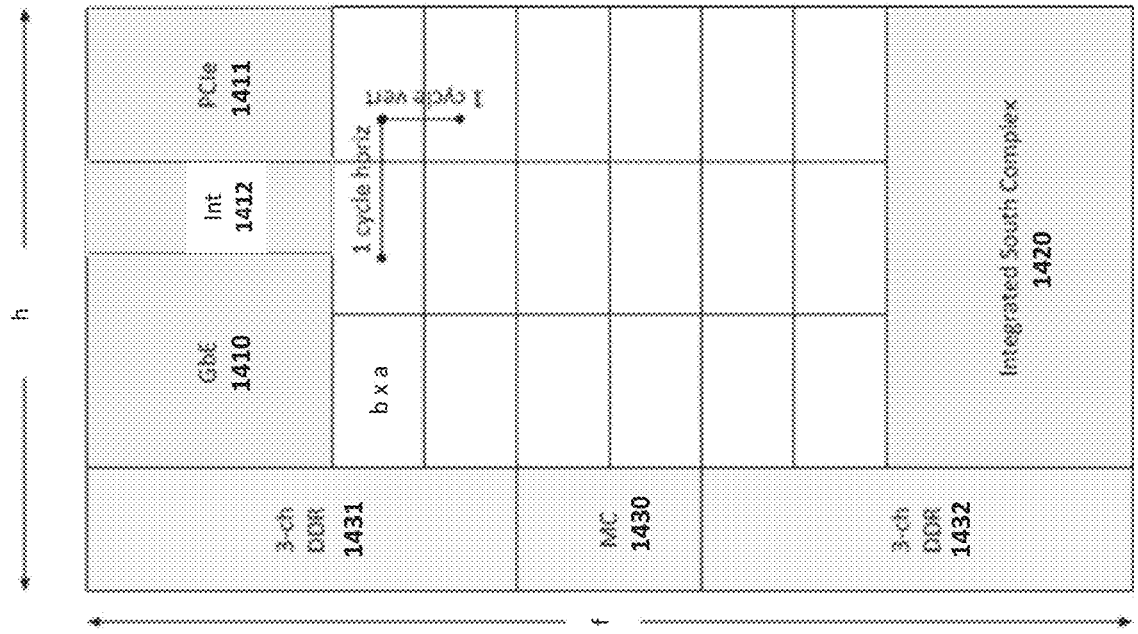
FIG. 14A-B illustrates how the bottom die may be chopped to support a landing slot array having a smaller number of landing slots.
Figure 14A:
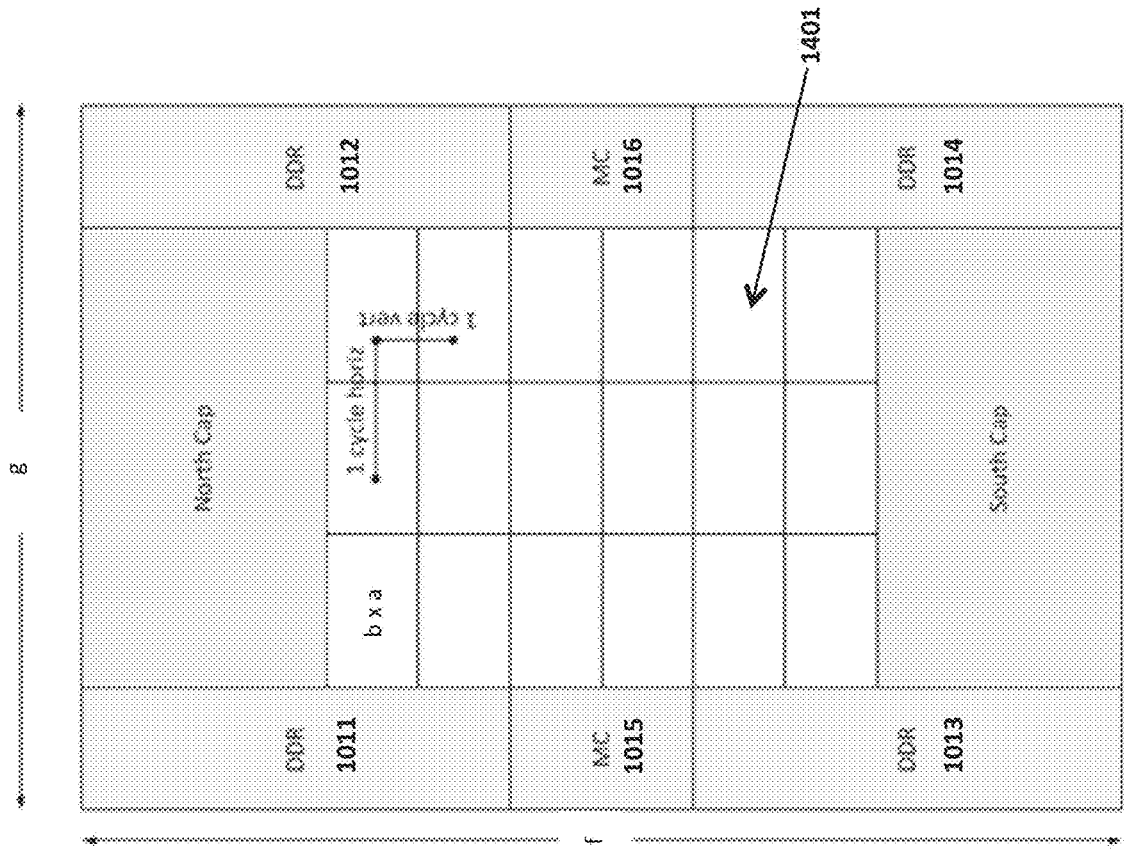

For other markets using the lower core counts, the cost overhead of the large bottom die can be too high if the customer does not require the large L3 cache. For these market segments, the bottom die 802 may be chopped to support a smaller number of landing slots 1401, as shown in FIG. 14A. The same sea-of-cores wafer 1201 may be used for the smaller bottom die to create 18, 15, 12, 10, 8, 6 or 4 core products (not shown). FIG. 14B shows the bottom (uncore) die for the micro-server product that has integrated 10Gb Ethernet 1410 (in the north cap), an interconnect 1412

(e.g., QuickPath Interconnect (QPI) or other interconnect type), and PCI express 1411. Also illustrated is an integrated south complex 1420 using a process technology required for the chipset integration. A single memory controller block 1430 with two 3-channel DDR units 1431-1432 is also shown.

Various other functions may be integrated using the sea-of-cores concept described herein. For example, 4 Atom® cores can be assembled in the same footprint of one large core (e.g., i7 cores, Xeon processor cores, etc), using the same Inter-Die-Interface (IDI) 905, 915 to the bottom (uncore) die (e.g., using Through-Silicon Vias (TSVs) 804). Graphics units (GT) are also currently being used in servers to accelerate parallel computations. They may use the same IDI interface 905, 915 to connect to the bottom (uncore) die 802. Customers require various ratios of compute cores vs. graphics cores for different applications, which require multiple die and packages using today's monolithic approach. The modular 3D stacking presented here enables multiple compute and graphics sizing options using the same package and silicon building blocks.

In addition, some implementations require FPGA blocks embedded in server processors. For example, an FPGA block can be built that matches the size of the core slot (or a multiple of it) and uses the same IDI interface. The FPGAs may be arrayed on a sea-of-cores wafer and as many as needed may be cut for the server chip. Accelerators may be defined to fit the exact outline of the landing slot and fabricated using a Custom Foundry service. The advantage of FPGAs and customer-designed accelerators is that they protect the individual IP of that customer and enable them to differentiate their server products or data centers.

Figure 15:
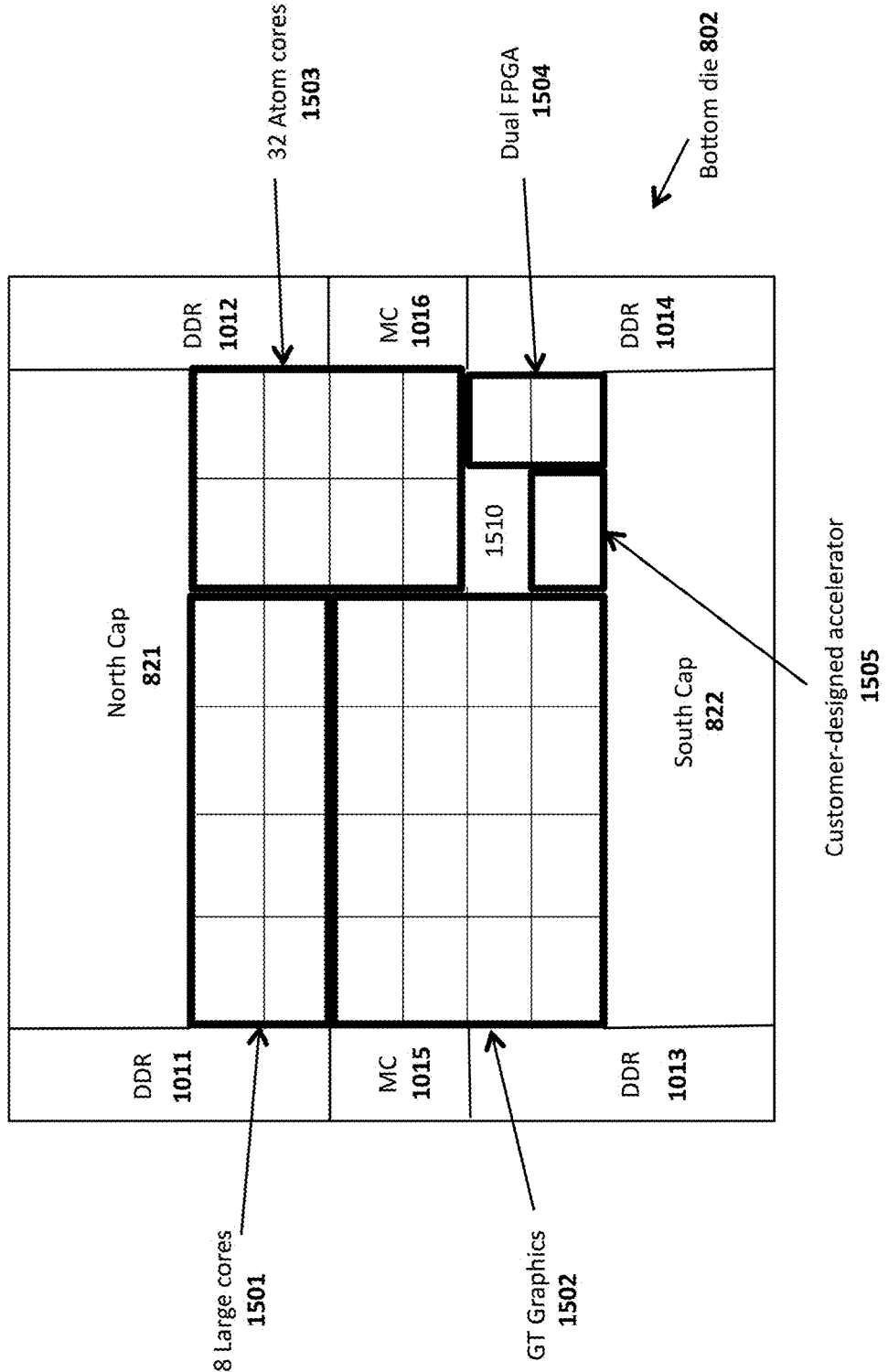
FIG. 15 illustrates an exemplary embodiment of a processor incorporating a plurality of different building blocks.

FIG. 15 shows an exemplary embodiment of such a processor incorporating all these building blocks. In particular, this embodiment includes 8 large cores 1501, a set of GT graphics cores 32 Atom cores 1503, dual FPGAs 1504, and a custom-designed accelerator 1505 overlaid on the bottom die 802. This Lego-like ability to incorporate big and small cores, graphics, FPGAs and custom accelerators provides an unprecedented flexibility to customize server processors at assembly time for specific OEM workloads and compute requirements. Note that some slots may remain unused in the top strata, even though the L3 cache underneath those slots is functional and the mesh keeps running under them (there is one unused slot 1510 in the example shown in FIG. 15).

Figure 16A:
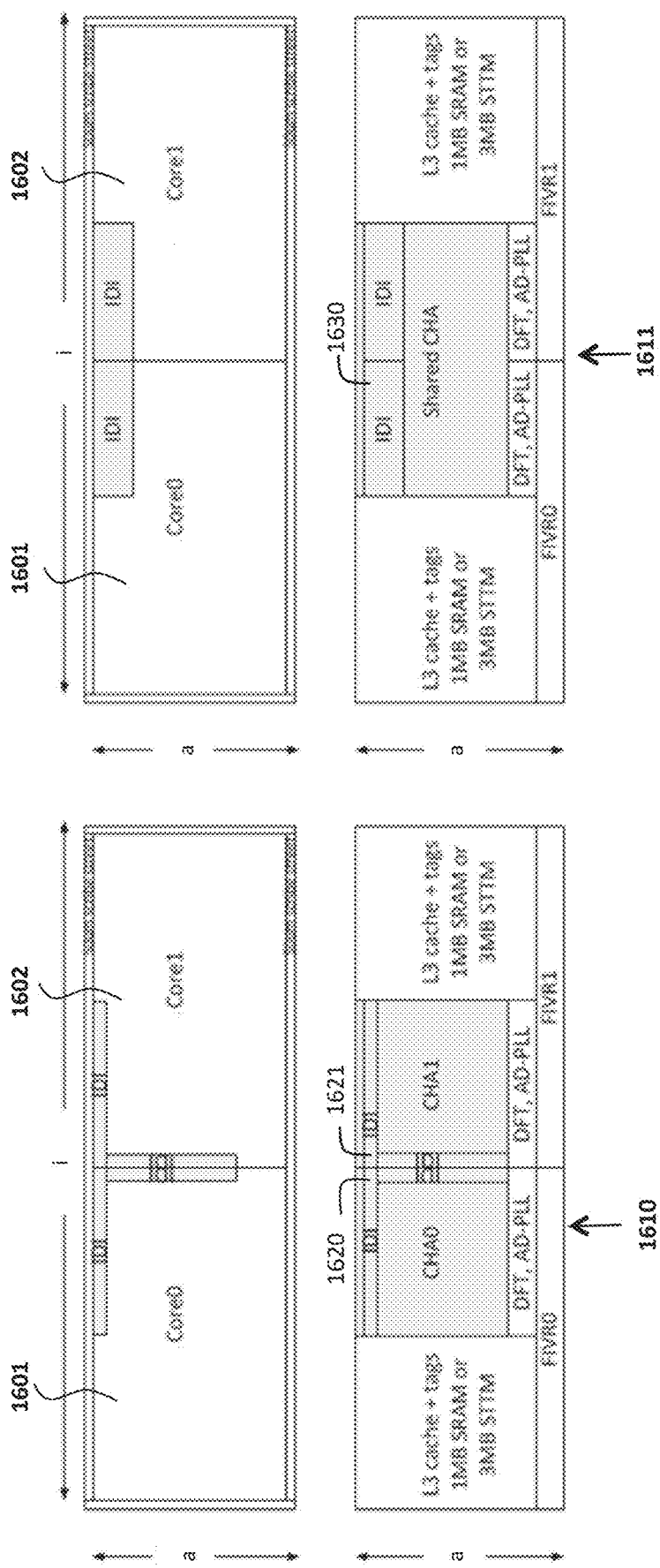
FIGS. 16A-B illustrate the cores clustered in groups of two cores.
Figure 16B:
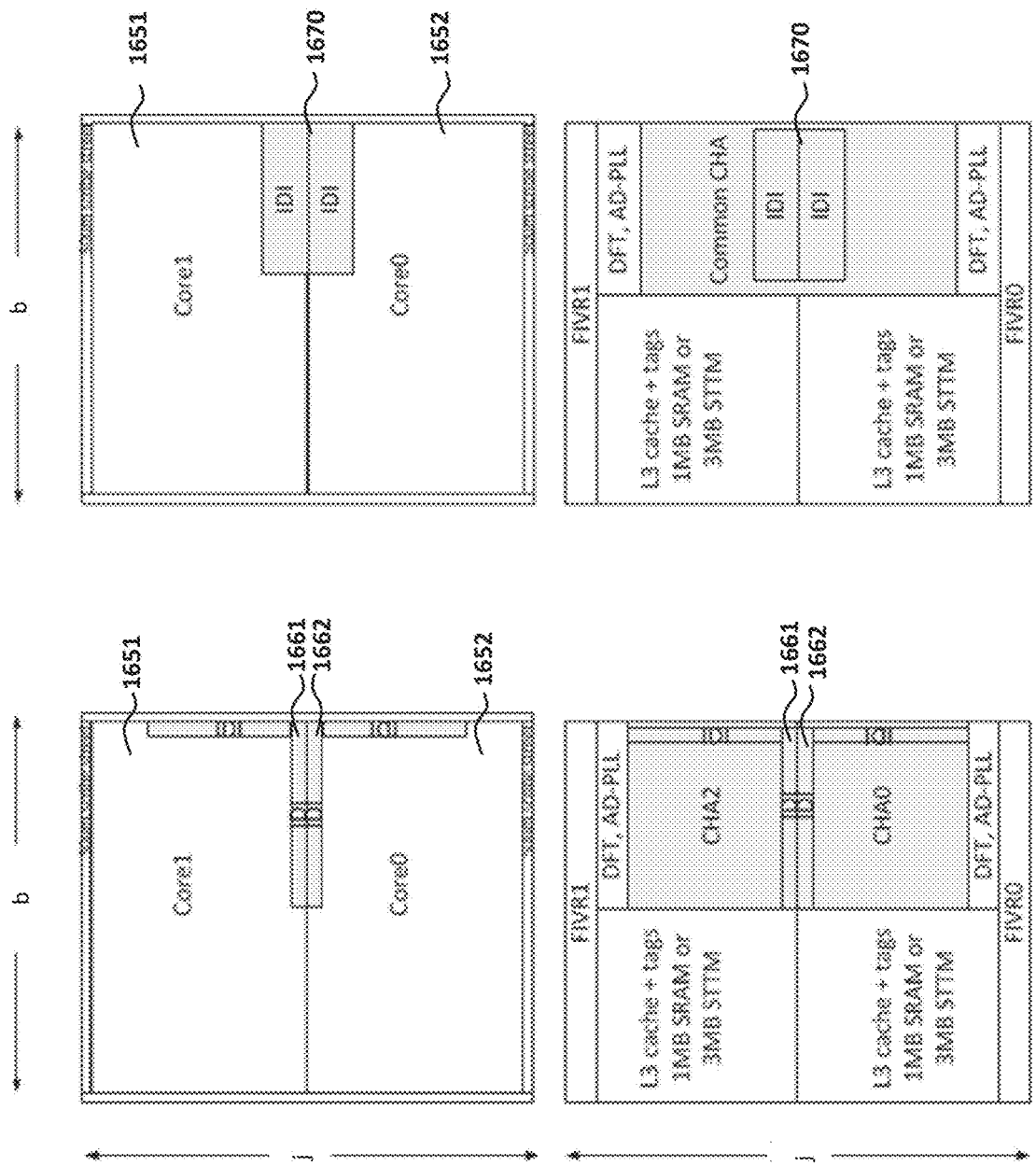
Figure 17:
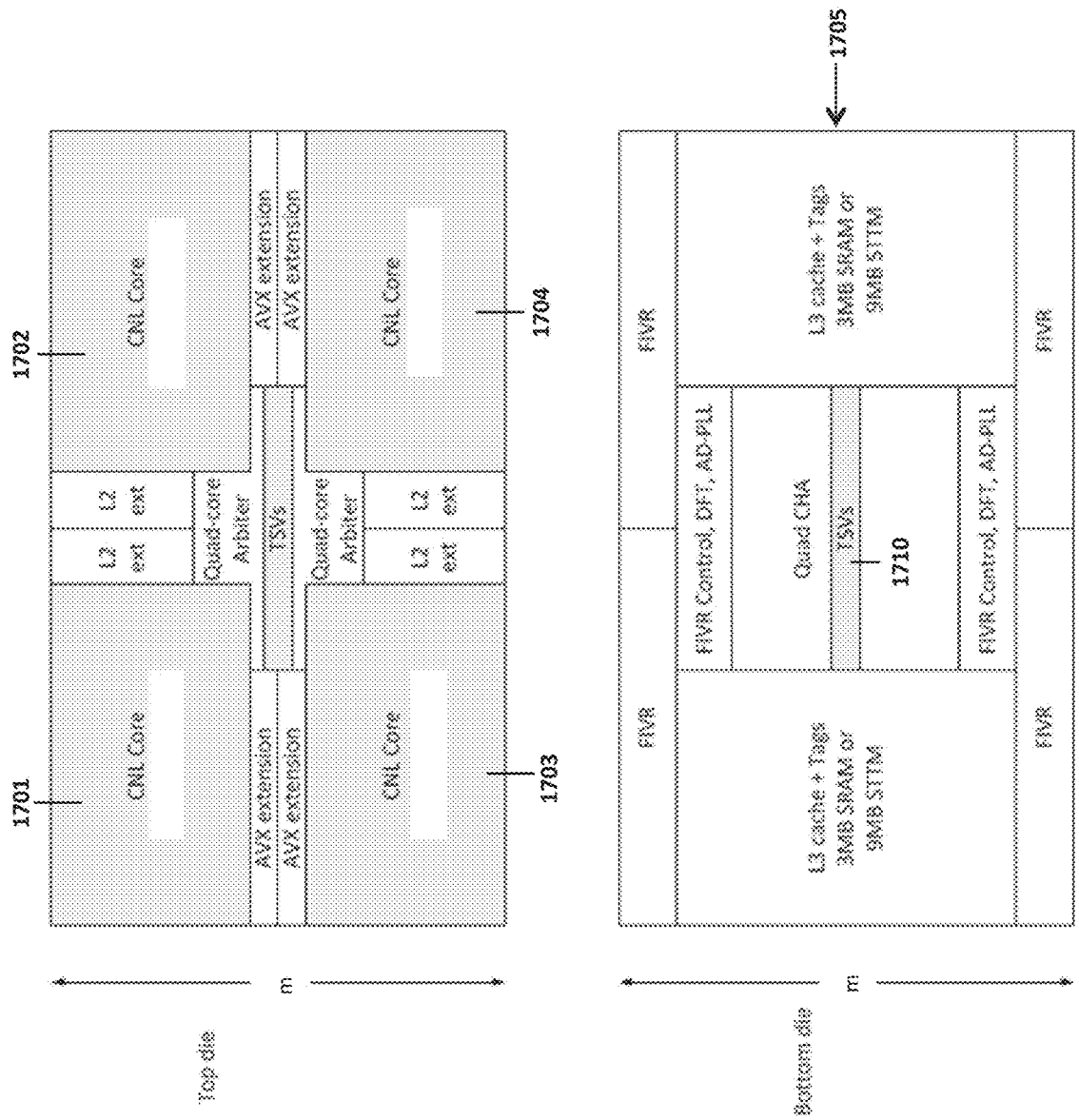
FIG. 17 illustrates the cores clustered in groups of four cores.

As the core size shrinks with smaller process geometries, the overhead of the single scribe line between the cores on the sea-of-cores wafer will increase. To reduce this overhead, the cores may be clustered in groups of two cores 1601-1602 (as shown in FIG. 16A-B) or four (as shown in FIG. 17). IN particular, FIG. 16A illustrates side-by-side dual core clusters (top) and matching uncore slots (bottom). The left side has a per-core dedicated IDI interface 1620-1621, while right side has a shared IDI 1630 per-pair. FIG. 16B illustrates vertically-stacked dual core clusters 1651-1652 (top) and matching uncore slots (bottom). The left side has a per-core dedicated IDI interface 1661-1662, while right side has a shared IDI 1670 per-pair. FIG. 17 illustrates a quad core cluster (top) 1701-1704 and matching uncore landing slots 1705 (bottom) with shared through-silicon vias (TSVs) 1710.

As the core becomes smaller in future process technologies, the cluster size will increase (e.g., to 8) because the scribe width does not scale much with the process shrink. To avoid a bandwidth bottleneck in the IDUTSV interface between each core cluster and the bottom (uncore) die, the width of the IDUTSV may be increased in future generations.

Figure 18:
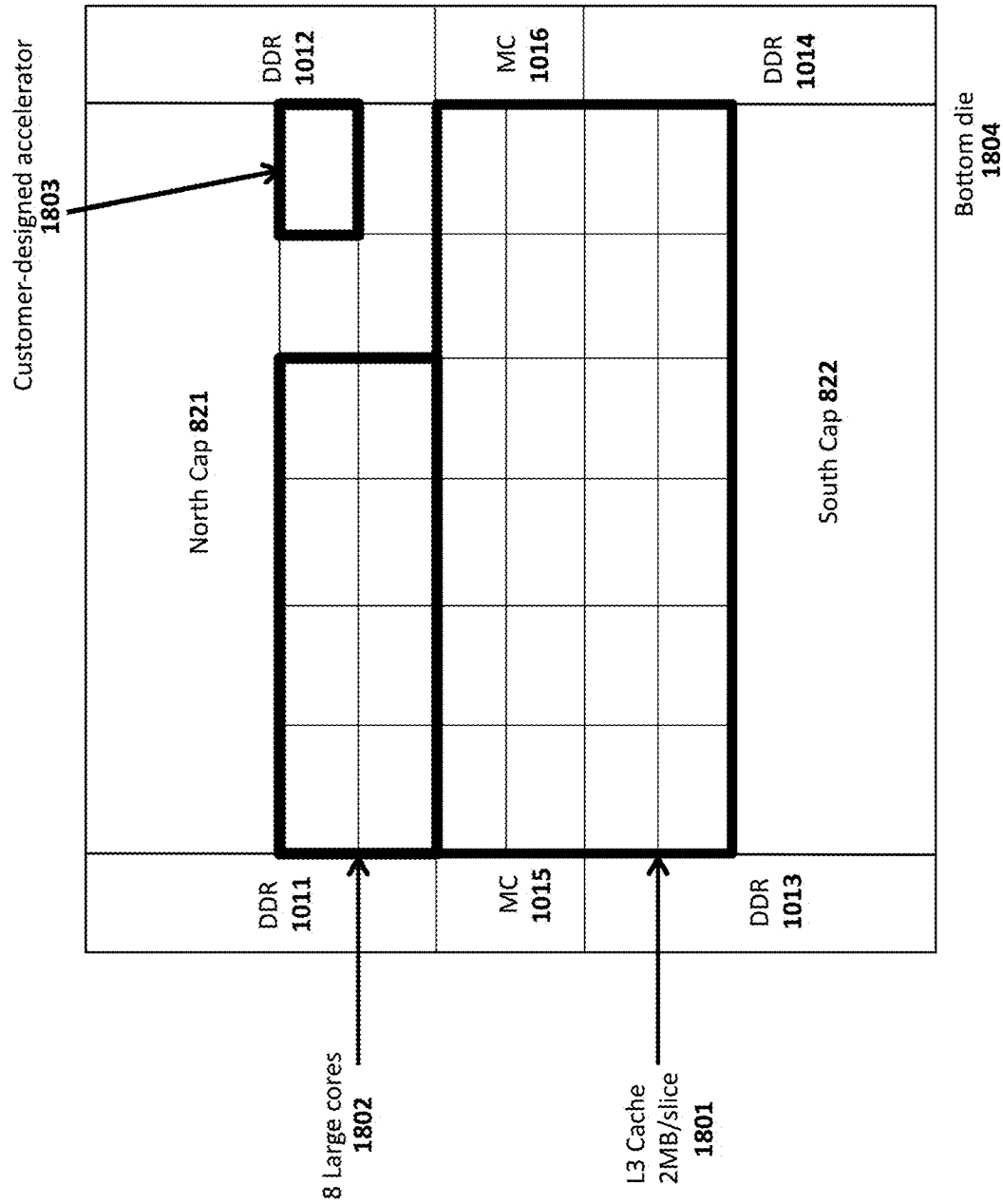
FIG. 18 illustrates an L3 cache implemented as a sea-of-cores in the latest process technology.

As illustrated in FIG. 18, an additional embodiment may include an L3 cache 1801 implemented as a sea-of-cores in the latest process technology. In one embodiment, L3 cache slices are added in 2 MB increments using 6T SRAM or 6 MB increments using STTM. While this is an expensive option, high-performance computing users may be willing to pay extra for configurations beyond the L3 cache size supported on the basic uncore die. In addition to the extra 48 MB of L3 cache 1801 (for a total of 84 MB L3 cache per socket), this embodiment also includes 8 large cores 1802, and a customer-designed accelerator 1803 on a single bottom die 1804.

The same bottom (uncore) die can be re-used for two server product generations, since the package is the same and it plugs into the same platform (typical platform lifetime is two years). This is an additional cost saving, which provides higher core counts in the same form factor without speeding up the I/O interfaces in the second year of the platform lifetime. For example, assume that the first year product uses core pairs (FIGS. 16A-B) in one generation. For the second year product, the core area will be cut in half due to the process scaling. In this case, the second year product top die will need to use quad cores in the same footprint as the previous year. In one embodiment, the core access to the IDI interface may be multiplexed appropriately to ensure they fall on the same IDI interface locations as the bottom die.

Figure 19:
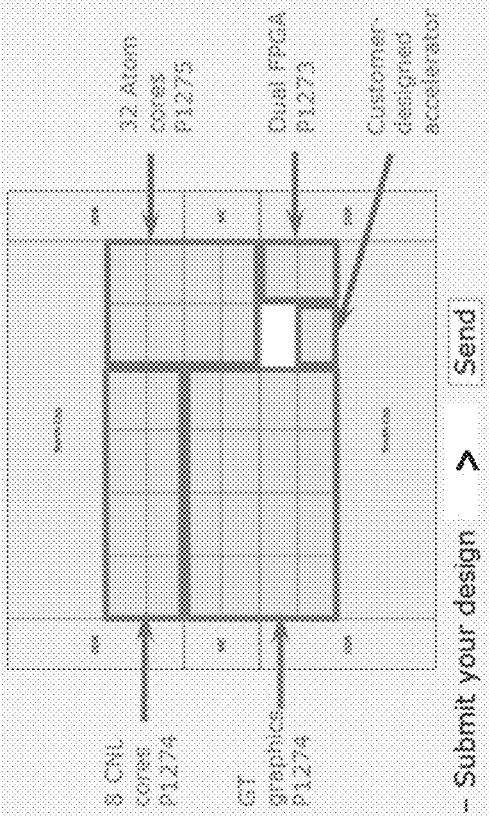
FIG. 19 illustrates an embodiment in which customers can build their own processor configurations.

The modular design presented herein enables customers to build their own processor configurations. Since each of the building blocks (large cores, small cores, graphics cores, FPGAs, L3 cache blocks and accelerators) are pre-built in sea-of-cores wafers and are all compatible with multiple base die configurations, customers can build their own processor configurations on a secure web site such as illustrated in FIG. 19. In this embodiment, the customer builds a custom server processor configuration using a 4 step process:

Step 1: Choose a base die and its associated package. This determines how many landing slots are available and what I/O interfaces are supported. As illustrated, in one embodiment, a group of options are provided from which the user may select via a mouse or other cursor control device. In the illustrated example, the user has selected a "36 slot server (6×6)."

Step 2: In this step, the user selects how to populate the existing landing slots (they are all compatible with the IDI interface in one embodiment). The customer can choose different building blocks and indicate how they will be cut out from the sea-of-cores wafers (i.e., how many horizontal and vertical slots as illustrated).

Step 3: This step involves placing the selected components on the bottom die in a way that maximizes the utilization of the existing landing slots. Some configurations will have empty slots that will be covered with high thermal conductivity mold. In one embodiment, once the user has made selections in steps 1 and 2, a recommended arrangement or set of arrangements may be visually displayed to the user in step 3.

Step 4: This last step may perform a verification of the selected configuration and submit the design to the processor manufacturer. Since all the building blocks are already available in the sea-of-cores wafers, they may be cut and a few prototype units may be assembled within a few days. In addition, initial testing may be performed and initial samples may be provided to the customer within just a couple of weeks. The production ramp is also fast, since all the building die are available in internal inventory and the package associated with each base die is already available.

The embodiments described herein provide value on several vectors:

1) Cost reduction: Two smaller 3D-stacked die have better yield than one large, monolithic die. A cost savings of up to $350M per server processor program has been estimated depending on the actual configuration used.

2) Reduced time-to-market: The uncore (bottom) die can be designed ahead of time and the sea-of-cores built when the client core is ready. This will enable server processors to ship about 3-6 months after the client processor introductions (today this time lag is over one year). In particular, all the I/O circuits (DDR, PCIe, QPI) can be debugged on the platform ahead of the core availability.

3) Better mesh RC performance: Since the uncore (bottom) die is built in an older process technology, it has lower mesh latency and higher frequency due to lower RC delays in the older process and shorter mesh routing underneath the cores. The mesh frequency increase is 10% with the reduced 1-cycle horizontal latency or up to 38% with the existing 2-cycle horizontal latency.

4) Mixing odd and even processes: Can support both Core (even process) and Atom (odd process) cores with the same uncore die. This is particularly useful for the micro-server market segment where there are presently two different product lines and a lack of an integrated south complex with the large cores.

5) Lego-like ability to incorporate big and little cores, graphics, FPGAs, customer designed accelerators and additional L3 slices: This provides an unprecedented flexibility to customize server processors at assembly time for specific OEM work-loads and compute requirements.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the Figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. A method comprising:

providing a secure website to a user for configuring a custom server processor, the secure website including a graphical user interface (GUI);

providing a first graphical element in the GUI, the first graphical element including a plurality of base die options from which a user is to select a base die and an associated package, each of the base die options associated with a respective number of landing slots and a respective plurality of supported I/O interface options;

providing a second graphical element in the GUI, the second graphical element including a plurality of building block options selectable by the user to populate the landing slots in the base die, each of the building block options associated with a respective building block and includes one or more fields for the user to specify a number of horizontal landing slots and a number of vertical landing slots to be occupied by the building block on the base die;

providing a third graphical element in the GUI, the third graphical element including a visual representation of a user configuration, the visual representation comprising one or more building blocks selected by the user in the second graphical element and arranged on the base die selected by the user in the first graphical element, wherein the visual representation of the user configuration is automatically generated based on the user's selections in the first graphical element and the second graphical element and comprises a recommended arrangement or set of arrangements of the one or more building blocks selected by the user, wherein the recommended arrangement or set of arrangements maximizes utilization of the landing slots on the base die; and performing a verification of the user configuration.

2. The method of claim 1, wherein the recommended arrangement or set of arrangements includes empty landing slots to be covered with high thermal conductivity mold.

3. The method of claim 1, further comprising:
generating a design of the user configuration responsive to a successful verification or validation of the user configuration.

4. The method of claim 3, further comprising:
submitting the design of the user configuration a processor manufacturer.

5. The method of claim 1, further comprising:
mounting the base die on the associated package, the base die comprising a plurality of exposed landing slots, each exposed landing slot including an inter-die interface usable to connect vertically to one of building blocks selected by the user, the base die including a plurality of base die components usable by building blocks including a memory controller component, a level 3 (L3) cache, a system memory or system memory interface, and a core interconnect fabric or bus;
vertically coupling a first building block comprising a first plurality of cores on top of the base die, the first plurality of cores spaced on the first building block to correspond to all or a first subset of the landing slots on the base die, each of the cores having an inter-die interface positioned to be communicatively coupled to a corresponding inter-die interface within a landing slot on the base die when the first building block is vertically coupled on top of the base die, wherein the communicative coupling between the inter-die interface of a core and the inter-die interface of its corresponding landing slot communicatively couples the core to the base die components of the base die; and
vertically coupling a second building block comprising a second plurality of cores on top of the base die, the second plurality of cores spaced on the second building block to correspond to a second subset of the landing slots on the base die different from the first subset, each of the cores on the second building block having an inter-die interface positioned to be communicatively coupled to a corresponding inter-die interface within a landing slot on the base die when the second building block is vertically coupled on top of the base die with the first building block, wherein the communicative coupling between the inter-die interface of a core and the inter-die interface of its corresponding landing slot communicatively couples the core to the base die components of the base die.

6. The method of claim 5, wherein the second plurality of cores comprise lower power and lower performance cores relative to the first plurality of cores which comprise higher power and higher performance cores relative to the second plurality of cores.

7. A non-transitory machine-readable medium having program code stored thereon which, when executed by a machine, causes the machine to perform operations of:
providing an application to a user for configuring a custom server processor, the application including a graphical user interface (GUI);
providing a first graphical element in the GUI, the first graphical element including a plurality of base die options from which a user is to select a base die and an associated package, each of the base die options associated with a respective number of landing slots and a respective plurality of supported I/O interface options;
providing a second graphical element in the GUI, the second graphical element including a plurality of building block options selectable by the user to populate the landing slots in the base die, each of the building block options associated with a respective building block and includes one or more fields for the user to specify a number of horizontal landing slots and a number of vertical landing slots to be occupied by the building block on the base die;
providing a third graphical element in the GUI, the third graphical element including a visual representation of a user configuration, the visual representation comprising one or more building blocks selected by the user in the second graphical element and arranged on the base die selected by the user in the first graphical element, wherein the visual representation of the user configuration is automatically generated based on the user's selections in the first graphical element and the second graphical element and comprises a recommended arrangement or set of arrangements of the one or more building blocks selected by the user, wherein the recommended arrangement or set of arrangements maximizes utilization of the landing slots on the base die; and
performing a verification of the user configuration.

8. The machine-readable medium of claim 7, wherein the recommended arrangement or set of arrangements includes empty landing slots to be covered with high thermal conductivity mold.

9. The machine-readable medium of claim 7, wherein the operations further comprise:
generating a design of the user configuration responsive to a successful verification or validation of the user configuration.

10. The machine-readable medium of claim 9, wherein the operations further comprise:
submitting the design of the user configuration a processor manufacturer.

11. A method comprising:
providing a secure website to a user for configuring a custom server processor, the secure website including a graphical user interface (GUI);
providing a first graphical element in the GUI, the first graphical element including a plurality of base die options from which a user is to select a base die and an associated package, each of the base die options associated with a respective number of landing slots and a respective plurality of supported I/O interface options;
providing a second graphical element in the GUI, the second graphical element including a plurality of building block options selectable by the user to populate the landing slots in the base die, each of the building block options associated with a respective building block and includes one or more fields for the user to specify a number of horizontal landing slots and a number of vertical landing slots to be occupied by the building block on the base die;
providing a third graphical element in the GUI, the third graphical element including a visual representation of a user configuration, the visual representation comprising one or more building blocks selected by the user in the second graphical element and arranged on the base die selected by the user in the first graphical element, wherein the visual representation of the user configuration is automatically generated based on the user's selections in the first graphical element and the second graphical element and comprises a recommended arrangement or set of arrangements of the one or more building blocks selected by the user, wherein the recommended arrangement or set of arrangements includes empty landing slots to be covered with high thermal conductivity mold; and performing a verification of the user configuration.

12. The method of claim 11, further comprising:

generating a design of the user configuration responsive to a successful verification or validation of the user configuration.

13. The method of claim 12, further comprising:

submitting the design of the user configuration a processor manufacturer.

14. The method of claim 11, further comprising:

mounting the base die on the associated package, the base die comprising a plurality of exposed landing slots, each exposed landing slot including an inter-die interface usable to connect vertically to one of building blocks selected by the user, the base die including a plurality of base die components usable by building blocks including a memory controller component, a level 3 (L3) cache, a system memory or system memory interface, and a core interconnect fabric or bus;

vertically coupling a first building block comprising a first plurality of cores on top of the base die, the first plurality of cores spaced on the first building block to correspond to all or a first subset of the landing slots on the base die, each of the cores having an inter-die interface positioned to be communicatively coupled to a corresponding inter-die interface within a landing slot on the base die when the first building block is vertically coupled on top of the base die, wherein the communicative coupling between the inter-die interface of a core and the inter-die interface of its corresponding landing slot communicatively couples the core to the base die components of the base die; and vertically coupling a second building block comprising a second plurality of cores on top of the base die, the second plurality of cores spaced on the second building block to correspond to a second subset of the landing slots on the base die different from the first subset, each of the cores on the second building block having an inter-die interface positioned to be communicatively coupled to a corresponding inter-die interface within a landing slot on the base die when the second building block is vertically coupled on top of the base die with the first building block, wherein the communicative coupling between the inter-die interface of a core and the inter-die interface of its corresponding landing slot communicatively couples the core to the base die components of the base die.

15. The method of claim 14, wherein the second plurality of cores comprise lower power and lower performance cores relative to the first plurality of cores which comprise higher power and higher performance cores relative to the second plurality of cores.

* * * * *